(12) United States Patent
Choi et al.

(10) Patent No.: US 12,457,861 B2
(45) Date of Patent: Oct. 28, 2025

(54) DISPLAY APPARATUS AND ELECTRONIC DEVICE INCLUDING THE SAME

(71) Applicant: Samsung Display Co., Ltd., Yongin-Si (KR)

(72) Inventors: Nakcho Choi, Yongin-si (KR); Taekgeun Lee, Yongin-si (KR); Yunkyeong In, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 717 days.

(21) Appl. No.: 17/674,663

(22) Filed: Feb. 17, 2022

(65) Prior Publication Data

US 2022/0415972 A1     Dec. 29, 2022

(30) Foreign Application Priority Data

Jun. 29, 2021   (KR) ..................... 10-2021-0084872

(51) Int. Cl.
| | |
|---|---|
| *H10K 59/124* | (2023.01) |
| *H10K 50/844* | (2023.01) |
| *H10K 50/86* | (2023.01) |
| *H10K 59/121* | (2023.01) |
| *H10K 59/122* | (2023.01) |
| *H10K 59/123* | (2023.01) |

(Continued)

(52) U.S. Cl.
CPC ......... *H10K 59/124* (2023.02); *H10K 50/844* (2023.02); *H10K 50/865* (2023.02); *H10K 59/121* (2023.02); *H10K 59/122* (2023.02); *H10K 59/123* (2023.02); *H10K 59/126* (2023.02); *H10K 59/38* (2023.02); *H10K 59/40* (2023.02); *H10K 59/65* (2023.02); *H10K 59/8792* (2023.02)

(58) Field of Classification Search
CPC ........ H10K 59/00; H10K 59/60; H10K 59/65; H10K 59/124; H10K 59/122; H10K 59/38

See application file for complete search history.

(56) References Cited

U.S. PATENT DOCUMENTS

| | | | |
|---|---|---|---|
| 9,660,010 B2 | 5/2017 | Park et al. | |
| 9,728,591 B2 | 8/2017 | Yoon et al. | |

(Continued)

FOREIGN PATENT DOCUMENTS

| | | |
|---|---|---|
| KR | 10-2016-0098604 A | 8/2016 |
| KR | 10-2017-0055587 A | 5/2017 |

(Continued)

*Primary Examiner* — Jessica S Manno
*Assistant Examiner* — Ricky Verdes
(74) *Attorney, Agent, or Firm* — Innovation Counsel LLP

(57) ABSTRACT

A display apparatus includes a substrate, a first organic insulating layer, a second organic insulating layer, and a pixel defining layer. The substrate includes a first area that includes a display area, a line area, a transmission area, and a second area adjacent to the first area. The first organic insulating layer is arranged over the substrate of the first area and includes a first hole corresponding to the transmission area. The second organic insulating layer is arranged over the first organic insulating layer of the first area and includes a second hole corresponding to the transmission area. The pixel defining layer is arranged over the second organic insulating layer of the first area and includes a third hole corresponding to the transmission area.

28 Claims, 13 Drawing Sheets

(51) Int. Cl.
    *H10K 59/126*     (2023.01)
    *H10K 59/38*     (2023.01)
    *H10K 59/40*     (2023.01)
    *H10K 59/65*     (2023.01)
    *H10K 59/80*     (2023.01)

(56) References Cited

U.S. PATENT DOCUMENTS

| | | |
|---|---|---|
| 10,170,525 B2 | 1/2019 | Lee et al. |
| 11,437,458 B2 | 9/2022 | Chung et al. |
| 11,515,505 B2 | 11/2022 | Chung et al. |
| 11,871,601 B2 | 1/2024 | Chae et al. |
| 11,871,635 B2 | 1/2024 | Kim et al. |
| 2018/0040682 A1* | 2/2018 | Ebisuno ............ H10K 59/1213 |
| 2020/0295102 A1 | 9/2020 | Qin et al. |
| 2020/0403180 A1 | 12/2020 | Seon et al. |
| 2021/0096697 A1* | 4/2021 | Do ..................... G06F 3/0447 |
| 2021/0184155 A1 | 6/2021 | Chae et al. |
| 2021/0359047 A1 | 11/2021 | Yoon et al. |

FOREIGN PATENT DOCUMENTS

| | | |
|---|---|---|
| KR | 10-2020-0135637 A | 12/2020 |
| KR | 10-2021-0002232 A | 1/2021 |
| KR | 10-2021-0028296 A | 3/2021 |
| KR | 10-2021-0074447 A | 6/2021 |
| KR | 10-2261610 B1 | 6/2021 |
| KR | 10-2021-0142808 A | 11/2021 |

\* cited by examiner

FIG. 7

DISPLAY APPARATUS AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2021-0084872, filed on Jun. 29, 2021, in the Korean Intellectual Property Office, the disclosure of which is incorporated by reference herein in its entirety.

BACKGROUND

1. Field

One or more embodiments relate to a display apparatus and an electronic device including the same.

2. Description of the Related Art

Recently, display apparatuses have been used for various purposes. Also, as display apparatuses have become thinner and lighter, their range of use has widened.

As an active area in a display apparatus has increased, various functions have been added to the display apparatus. Research has been and is being conducted towards adding features in addition to displaying an image in the active area of the display device.

SUMMARY

According to an embodiment, an electronic device includes a housing including a rear side and a lateral side, a cover window arranged on the housing, a display apparatus arranged under the cover window, a sensor unit arranged under the display apparatus, and a camera unit arranged under the display apparatus, wherein the display apparatus includes a substrate including a first area including a display area, a line area, and a transmission area, and a second area adjacent to the first area, a first organic insulating layer arranged on the substrate of the first area and including a first hole corresponding to the transmission area, a second organic insulating layer on the first organic insulating layer of the first area and including a second hole of the transmission area, and a pixel defining layer on the second organic insulating layer of the first area and including a third hole corresponding to the transmission area.

The pixel defining layer may cover a side surface of the second organic insulating layer adjacent to the transmission area.

A horizontal distance between an end portion of the second organic insulating layer adjacent to the transmission area and an end portion of the pixel defining layer most adjacent to the end portion of the second organic insulating layer may be about 2 µm to about 8 µm in a vertical cross-sectional view.

A side surface of the first organic insulating layer adjacent to the transmission area may have a first angle with respect to a virtual line parallel to a horizontal plane of the substrate in a vertical cross-sectional view, and a side surface of the pixel defining layer adjacent to the transmission area may have a second angle with respect to the virtual line parallel to the horizontal plane of the substrate in the vertical cross-sectional view.

A sum of the first angle and the second angle may be greater than about 20° and less than or equal to about 40°, and the second angle may be greater than or equal to about 20° and less than or equal to about 30°.

The display apparatus may further include a pixel electrode arranged between the pixel defining layer and the second organic insulating layer of the first area.

A horizontal distance between an end portion of the second organic insulating layer adjacent to the transmission area and an end portion of the pixel electrode most adjacent to the end portion of the second organic insulating layer may be about 3 µm to about 6 µm in a vertical cross-sectional view.

The pixel defining layer may be provided in an isolated shape in a plan view.

The display apparatus may further include a black matrix and a color filter arranged on the pixel defining layer.

The black matrix may include an opening overlapping the pixel electrode, and the color filter may be located in the opening.

The display apparatus may further include an encapsulation member and an input sensor located between the pixel defining layer and the black matrix.

The display apparatus may further include a third organic insulating layer located between the first organic insulating layer and the substrate of the first area.

The third organic insulating layer may extend to the transmission area.

The display apparatus may further include at least one insulating layer located between the third organic insulating layer and the of the first area, wherein the at least one insulating layer may include a fourth hole corresponding to the transmission area, and the third organic insulating layer may cover a side surface of the at least one insulating layer.

The display apparatus may further include a light blocking layer located between the at least one insulating layer and the substrate of the first area, wherein the light blocking layer may include a fifth hole corresponding to the transmission area.

According to an embodiment, a display apparatus includes a substrate including a first area including a display area, a line area, and a transmission area, and a second area adjacent to the first area, a first organic insulating layer arranged over the substrate of the first area and including a first hole corresponding to the transmission area, a second organic insulating layer arranged over the first organic insulating layer of the first area and including a second hole corresponding to the transmission area, and a pixel defining layer arranged over the second organic insulating layer of the first area and including a third hole corresponding to the transmission area.

The pixel defining layer may cover a side surface of the second organic insulating layer adjacent to the transmission area.

A horizontal distance between an end portion of the second organic insulating layer adjacent to the transmission area and an end portion of the pixel defining layer most adjacent to the end portion of the second organic insulating layer may be about 2 µm to about 8 µm in a vertical cross-sectional view.

A side surface of the first organic insulating layer adjacent to the transmission area may have a first angle with respect to a virtual line parallel to a horizontal plane of the substrate in a vertical cross-sectional view, and a side surface of the pixel defining layer adjacent to the transmission area may have a second angle with respect to the virtual line parallel to the horizontal plane of the substrate in the vertical cross-sectional view.

A sum of the first angle and the second angle may be less than or equal to about 40°, and the second angle may be greater than or equal to about 20° and less than or equal to about 30°.

The display apparatus may further include a pixel electrode arranged between the pixel defining layer and the second organic insulating layer of the first area.

A horizontal distance between an end portion of the second organic insulating layer adjacent to the transmission area and an end portion of the pixel electrode most adjacent to the end portion of the second organic insulating layer may be about 3 μm to about 6 μm in a vertical cross-sectional view.

The pixel defining layer may be provided in an isolated shape in a plan view.

The display apparatus may further include a black matrix and a color filter arranged on the pixel defining layer.

The black matrix may include an opening overlapping the pixel electrode, and the color filter may be located in the opening.

The display apparatus may further include an encapsulation member and an input sensor located between the pixel defining layer and the black matrix.

The display apparatus may further include a third organic insulating layer located between the first organic insulating layer and the substrate of the first area.

The third organic insulating layer may extend to the transmission area.

The display apparatus may further include at least one insulating layer located between the third organic insulating layer and the substrate of the first area, wherein the at least one insulating layer may include a fourth hole corresponding to the transmission area, and the third organic insulating layer may cover a side surface of the at least one insulating layer.

The display apparatus may further include a light blocking layer located between the at least one insulating layer and the substrate of the first area, wherein the light blocking layer may include a fifth hole corresponding to the transmission area.

Other aspects, features, and advantages other than those described above will become apparent from the following detailed description, the appended claims, and the accompanying drawings.

BRIEF DESCRIPTION OF THE DRAWINGS

The above and other aspects, features, and advantages of certain embodiments will be more apparent from the following description taken in conjunction with the accompanying drawings, in which:

FIG. 7 is a cross-sectional view of an active area included in an electronic device according to an embodiment;

DETAILED DESCRIPTION

Figure 1:
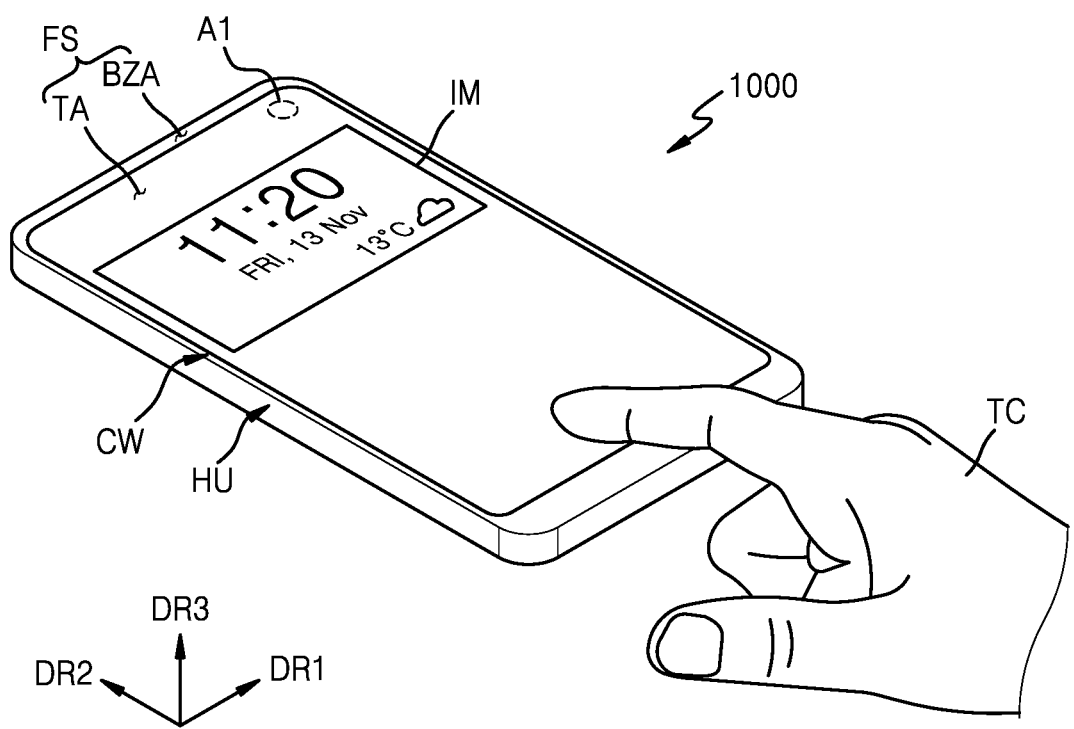
FIG. 1 is a perspective view schematically illustrating an electronic device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

It will be understood that although terms such as "first" and "second" may be used herein to describe various elements, these elements should not be limited by these terms and these terms are only used to distinguish one element from another element.

It will be understood that terms such as "comprise," "include," and "have" used herein specify the presence of stated features or components, but do not preclude the presence or addition of one or more other features or components.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

Sizes of elements in the drawings may be exaggerated for convenience of description. In other words, because the sizes and thicknesses of elements in the drawings are arbitrarily illustrated for convenience of description, the disclosure is not limited thereto.

In the following embodiments, the meaning of a line "extending in a first direction or a second direction" may include not only extending in a linear shape but also extending in a zigzag or curved shape along the first direction or the second direction.

In the following embodiments, when referred to as "in a plan view," it may mean that a target portion is viewed from above, and when referred to as "in a cross-sectional view," it may mean that a cross-section of a target portion vertically cut is viewed from side. In the following embodiments, when referred to as "overlapping," it may include overlapping "in a plan view" and overlapping "in a cross-sectional view."

Hereinafter, embodiments will be described in detail with reference to the accompanying drawings, and in the following description, like reference numerals will denote like elements.

Figure 2A:
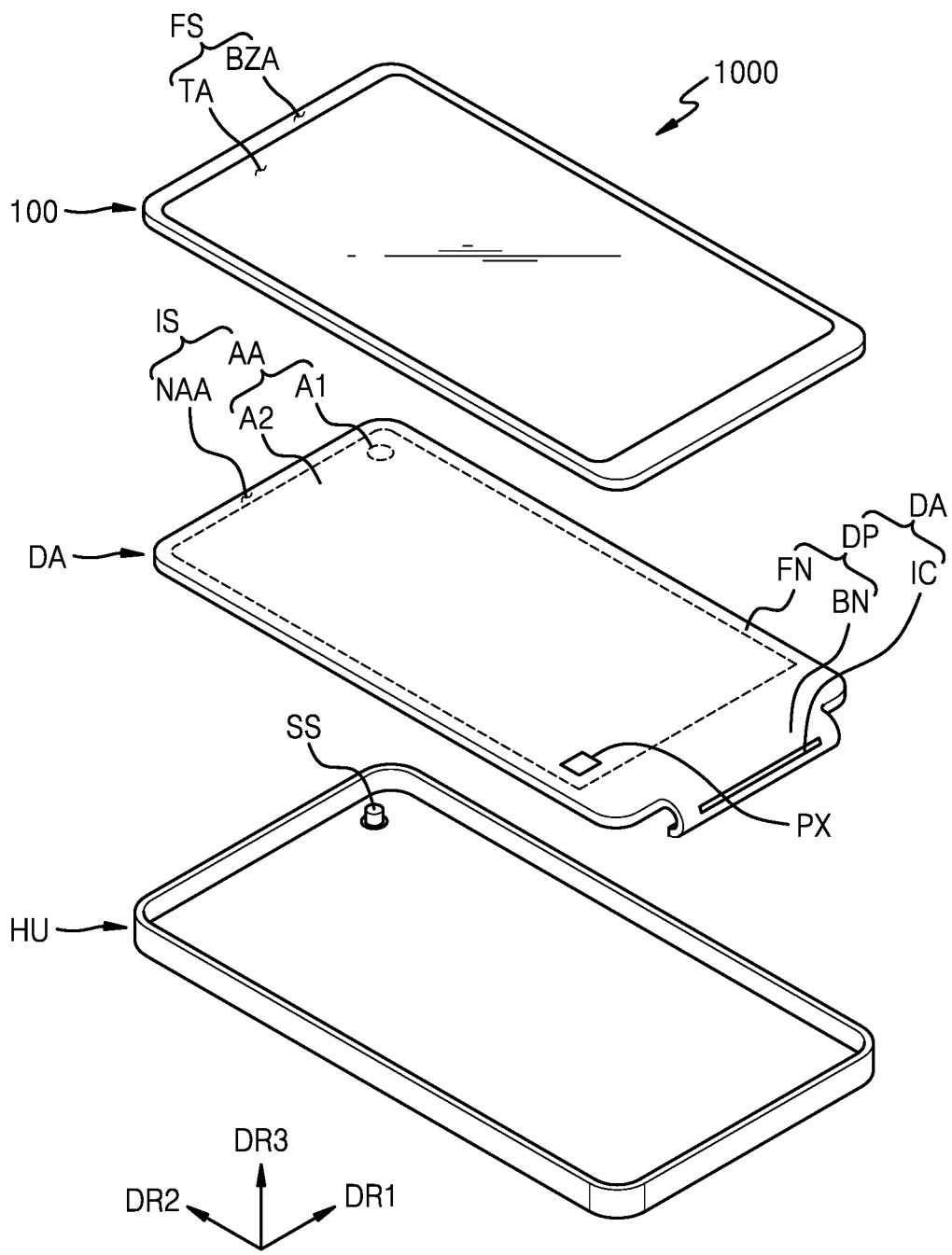
FIG. 2A is an exploded perspective view of an electronic device according to an embodiment.
Figure 2B:
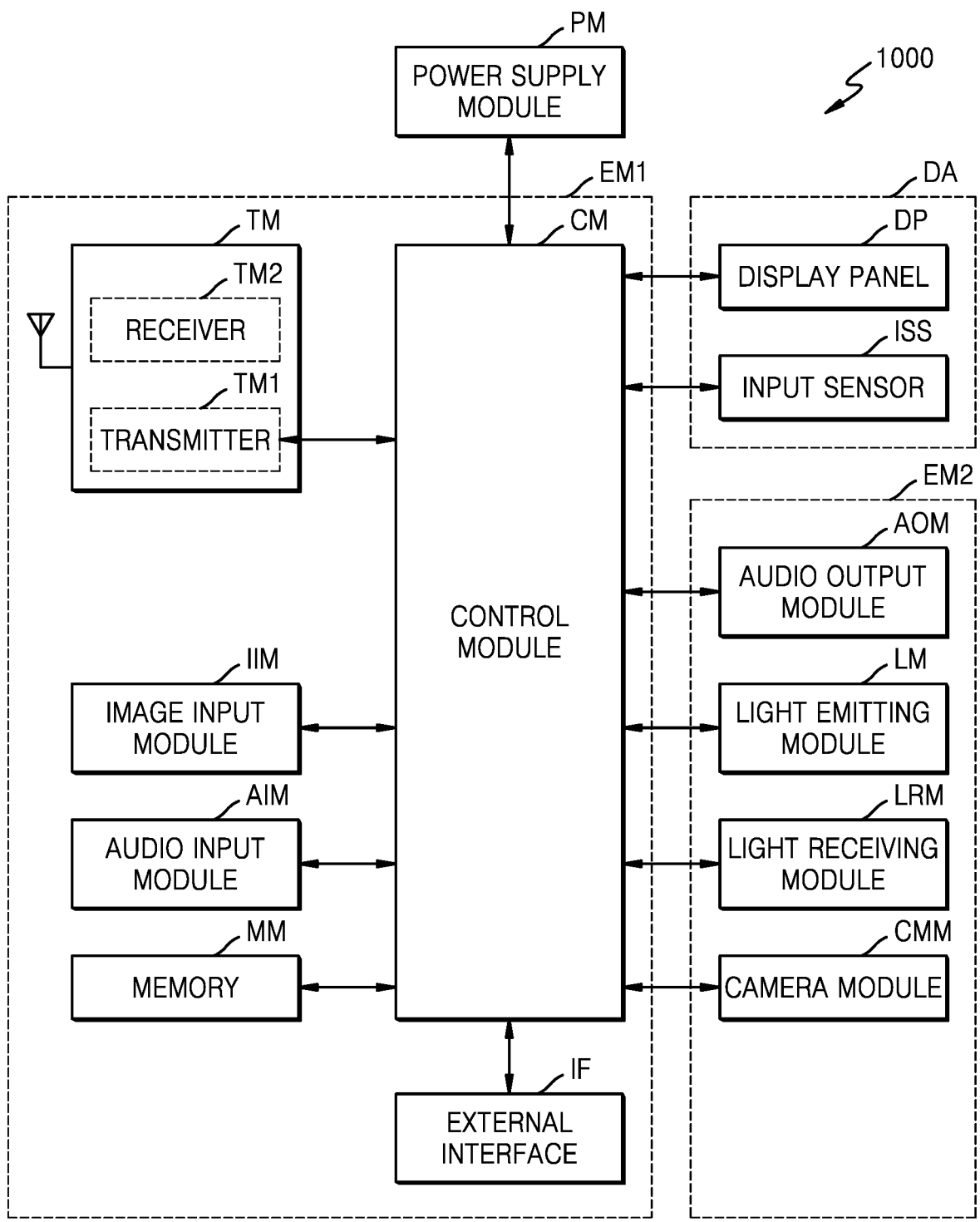
FIG. 2B is a block diagram of an electronic device according to an embodiment.

FIG. 1 is a perspective view schematically illustrating an electronic device according to an embodiment, FIG. 2A is an exploded perspective view of an electronic device according to an embodiment, and FIG. 2B is a block diagram of an electronic device according to an embodiment.

An electronic device 1000 according to an embodiment may be an apparatus displaying a moving image or a still image and may be used as a display screen of various products such as televisions, notebook computers, monitors, billboards, and Internet of Things (IoT) as well as portable electronic devices such as mobile phones, smart phones, tablet personal computers (PCs), mobile communication terminals, electronic notebooks, electronic books, portable multimedia players (PMPs), navigation, and Ultra Mobile PCs (UMPCs). Also, the electronic device 1000 according to an embodiment may be used in wearable devices such as smart watches, watch phones, glasses-type displays, and head-mounted displays (HMDs). Also, the electronic device 1000 according to an embodiment may be used as a center information display (CID) arranged at a vehicle's instrument panel or a vehicle's center fascia or dashboard, a room mirror display replacing a vehicle's side mirror, or a display arranged at a rear side of a vehicle's front seat as an entertainment for a vehicle's rear seat. For convenience of description, FIG. 1 illustrates that the electronic device 1000 is used as a smart phone.

Referring to FIGS. 1, 2A, and 2B, the electronic device 1000 may display an image IM in a third direction DR3 on a display surface IS parallel to each of a first direction DR1 and a second direction DR2. The display surface FS on which the image IM is displayed may correspond to the front side of the electronic device 1000 and may correspond to a front side FS of a cover window CW.

Hereinafter, the same reference numeral will be used for the display surface and the front side of the electronic device 1000 and the front side of the cover window CW. The image IM may include a still image as well as a dynamic image. In FIG. 1, a clock is illustrated as an embodiment of the image IM.

In embodiments, the front side (or upper surface, front surface) and the rear side (or lower surface, rear surface) of each of members are defined based on the direction in which the image IM is displayed. The front side and the rear side may be opposite to each other in the third direction DR3, and the normal direction of each of the front side and the rear side may be parallel to the third direction DR3. The distance between the front side and the rear side in the third direction DR3 may correspond to the thickness of a display apparatus DA in the third direction DR3.

The electronic device 1000 according to an embodiment may sense a user input TC applied from the outside. The user input TC may include various types of external inputs such as a portion of the user's body, light, heat, and pressure. In an embodiment, the user input TC is illustrated as the user's hand applied to the front surface. However, the disclosure is not limited thereto. The user input TC may be provided in various types, and the electronic device 1000 may sense the user input TC applied to the lateral side or rear side of the electronic device 1000 according to the structure of the electronic device 1000.

Moreover, in an embodiment, a first area A1 may be defined inside a transparent area TA. The first area A1 may be an area at least partially overlapping an electronic module SS. Although FIG. 1 illustrates that the first area A1 is provided in a circular shape at the upper right end of the electronic device 1000, the disclosure is not limited thereto. The first area A1 may be provided in various numbers and shapes according to the number and shape of electronic modules SS.

Through the first area A1, the electronic device 1000 may receive an external signal necessary for the electronic module SS or may provide a signal output from the electronic module SS to the outside. In an embodiment, because the first area A1 is provided to overlap the transparent area TA, the area of a bezel area BZA for forming the transparent area TA may be reduced.

The electronic device 1000 may include a cover window CW, a housing HU, a display apparatus DA, and an electronic module SS. In an embodiment, the cover window CW and the housing HU may be combined to form the appearance of the electronic device 1000.

The cover window CW may include an insulating panel. For example, the cover window CW may include glass, plastic, or a combination thereof.

The front side FS of the cover window CW may define the front side of the electronic device 1000. The transparent area TA may be optically transparent. For example, the transparent area TA may have a visible light transmittance of about 90% or more.

The bezel area BZA may define the shape of the transparent area TA. The bezel area BZA may be adjacent to the transparent area TA and may surround the transparent area TA. The bezel area BZA may have a lower light transmittance than the transparent area TA. The bezel area BZA may include an opaque material that blocks light. The bezel area BZA may have a certain color. The bezel area BZA may be defined by a bezel layer provided separately from a transparent substrate defining the transparent area TA or may be defined by an ink layer formed by being inserted or colored in a transparent substrate.

The display apparatus DA may include a display panel DP displaying an image IM, an input sensor ISS (see FIG. 2B) sensing an external input TC, and a driving circuit IC. The display apparatus DA may include a front surface IS including an active area AA and a peripheral area NAA. The active area AA may be activated according to an electrical signal.

In an embodiment, the active area AA may be an area in which the image IM is displayed and simultaneously may be an area in which the external input TC is sensed. The active area AA may be an area in which a plurality of pixels PX described below are arranged.

The transparent area TA may at least partially overlap the active area AA. For example, the transparent area TA may overlap the front surface of the active area AA or may overlap at least a portion of the active area AA. Accordingly, through the transparent area TA, the user may visually recognize the image IM or provide the external input TC. However, the disclosure is not limited thereto. For example, in the active area AA, an area in which the image IM is displayed and an area in which the external input TC is sensed may be separated from each other.

The peripheral area NAA may at least partially overlap the bezel area BZA. The peripheral area NAA may be covered by the bezel area BZA. The peripheral area NAA may be adjacent to the active area AA. The peripheral area NAA may surround the active area AA. The peripheral area NAA may be an area in which the image IM is not displayed. A driving circuit or a driving line or the like for driving the active area AA may be arranged in the peripheral area NAA.

In an embodiment, the display apparatus DA may be assembled in a flat state in which the active area AA and the peripheral area NAA face the cover window CW. However, the disclosure is not limited thereto. A portion of the peripheral area NAA of the display apparatus DA may be bent. In this case, a portion of the peripheral area NAA may face the rear side of the electronic device 1000, and thus the bezel area BZA seen on the front side of the electronic device 1000 may be reduced. Alternatively, the display apparatus DA may be assembled in a state where a portion of the active area AA is bent. Alternatively, the peripheral area NAA may be omitted in the display apparatus DA.

The active area AA may include a first area A1 and a second area A2. The first area A1 may have a higher light transmittance than the second area A2. Also, the first area 1A may have a smaller area than the second area 2A. The first area A1 may be defined as an area overlapping an area of the display apparatus DA in which the electronic module SS is arranged inside the housing HU. In an embodiment, the first area A1 is illustrated as having a circular shape; however, the disclosure is not limited thereto and the first area A1 may have various shapes such as a polygon, an ellipse, and a figure having at least one curve.

The second area A2 may be adjacent to the first area A1. In an embodiment, the second area A2 may entirely surround the first area A1. However, the disclosure is not limited thereto. The second area A2 may partially surround the first area A1.

Referring to FIG. 2B, the display apparatus DA may include the display panel DP and the input sensor ISS. The display panel DP may be configured to generate the image IM. The image IM generated by the display panel DP may be displayed on the display surface IS through the transparent area TA and may be visually recognized by the user from the outside.

The input sensor ISS may detect the external input TC applied from the outside. The input sensor ISS may detect the external input TC provided to the cover window CW.

Referring back to FIG. 2A, the display panel DP may include a flat portion FN and a bending portion BN. The flat portion FN may be assembled in a state substantially parallel to a plane defined by the first direction DR1 and the second direction DR2. The active area AA may be provided in the flat portion FN.

The bending portion BN may extend from the flat portion FN, and at least a portion of the bending portion BN may be bent. The bending portion BN may be bent from the flat portion FN and assembled to be located on the rear side of the flat portion FN. When the bending portion BN is assembled, because the bending portion BN may overlap the flat portion FN in the plan view, the bezel area BZA of the electronic device 1000 may be reduced. However, the disclosure is not limited thereto. For example, the bending portion BN may be omitted.

The driving circuit IC may be mounted on the bending portion BN. The driving circuit IC may be provided in the form of a chip. However, the disclosure is not limited thereto. The driving circuit IC may be provided on a separate circuit board and electrically connected to an electronic panel (EP) through a flexible film or the like.

The driving circuit IC may be electrically connected to the active area AA to transmit an electrical signal to the active area AA. For example, the driving circuit IC may include a data driving circuit and may provide data signals to the pixels PX arranged in the active area AA. Alternatively, the driving circuit IC may include a touch driving circuit and may be electrically connected to the input sensor ISS arranged in the active area AA. Moreover, the driving circuit IC may include various circuits in addition to the above circuits or may be designed to provide various electrical signals to the active area AA.

Moreover, the electronic device 1000 may further include a main circuit board electrically connected to the display panel DP and the driving circuit IC. The main circuit board may include various driving circuits for driving the electronic panel (EP) or a connector or the like for supplying power. The main circuit board may be a rigid printed circuit board (PCB) or a flexible circuit board.

The electronic module SS may be arranged under the display apparatus DA. The electronic module SS may receive an external input transmitted through the first area A1 or may output a signal through the first area A1. In an embodiment, because the first area A1 having a relatively high transmittance is provided inside the active area AA, the electronic module SS may be arranged to overlap the active area AA and accordingly the area (or size) of the bezel area BZA may be reduced.

Referring to FIG. 2B, the electronic device 1000 may include a display apparatus DA, a power supply module PM, a first electronic module EM1, and a second electronic module EM2. The display apparatus DA, the power supply module PM, the first electronic module EM1, and the second electronic module EM2 may be electrically connected to each other. In FIG. 2B, the display panel DP and the input sensor ISS among the components of the display apparatus DA are illustrated as an example.

The power supply module PM may supply power necessary for the overall operation of the electronic device 1000. The power supply module PM may include a general battery module.

The first electronic module EM1 and the second electronic module EM2 may include various functional modules for operating the electronic device 1000. The first electronic module EM1 may be directly mounted on a motherboard electrically connected to the display panel DP or may be mounted on a separate substrate and electrically connected to a motherboard through a connector (not illustrated) or the like.

The first electronic module EM1 may include a control module CM, a wireless communication module TM, an image input module IIM, an audio input module AIM, a memory MM, and an external interface IF. Some of the modules may not be mounted on the motherboard but may be electrically connected to the motherboard through a flexible circuit board.

The control module CM may control the overall operation of the electronic device 1000. The control module CM may be a microprocessor. For example, the control module CM may activate or deactivate the display panel DP. The control module CM may control other modules such as the image input module IIM and the audio input module AIM based on a touch signal received from the display panel DP.

The wireless communication module TM may transmit/receive a wireless signal to/from another terminal by using a Bluetooth or WiFi line. The wireless communication module TM may transmit/receive a voice signal by using a general communication line. The wireless communication module TM may include a transmitter TM1 that modulates and transmits a signal to be transmitted and a receiver TM2 that demodulates a received signal.

The image input module IIM may process an image signal and convert the same into image data displayable on the display apparatus DA. The audio input module AIM may receive an external audio signal through a microphone in a recording mode, a voice recognition mode, or the like and convert the same into electrical voice data.

The external interface IF may function as an interface connected to an external charger, a wired/wireless data port, a card socket (e.g., a memory card or a SIM/UIM card), or the like.

The second electronic module EM2 may include an audio output module AOM, a light emitting module LM, a light receiving module LRM, and a camera module CMM. The second electronic module EM2 may be directly mounted on a motherboard, may be mounted on a separate substrate and electrically connected to the display apparatus DA through a connector (not illustrated) or the like, or may be electrically connected to the first electronic module EM1.

The audio output module AOM may convert audio data received from the wireless communication module TM or audio data stored in the memory MM and output the result thereof to the outside.

The light emitting module LM may generate and output light. The light emitting module LM may output infrared rays. For example, the light emitting module LM may include an LED device. For example, the light receiving module LRM may sense infrared rays. The light receiving module LRM may be activated when an infrared ray of a certain level or more is sensed. The light receiving module LRM may include a CMOS sensor. After an infrared light generated by the light emitting module LM is output, the infrared light may be reflected by an external object (e.g., the user's finger or face) and the reflected infrared light may be incident on the light receiving module LRM. The camera module CMM may capture an external image.

In an embodiment, the electronic module SS may include at least one of the first electronic module EM1 and the second electronic module EM2. For example, the electronic module SS may include at least one of a camera, a speaker, a light sensor, and a heat sensor. The electronic module SS may sense an external object received through the front surface IS or may provide a sound signal such as a voice to the outside through the front surface IS. Also, the electronic module SS may include a plurality of components and is not limited to any embodiment.

Referring back to FIG. 2A, the housing HU may be coupled to the cover window CW. The cover window CW may be arranged on a front side FS of the housing HU. The housing HU may include a rear side and a lateral side. The cover window CW may be arranged on the rear side of the housing HU. That is, the cover window CW may be arranged on the housing HU. The housing HU may be coupled to the cover window CW to provide a certain accommodation space. The display apparatus DA and the electronic module SS may be accommodated in a certain accommodation space provided between the housing HU and the cover window CW.

The housing HU may include a material having a relatively high rigidity. For example, the housing HU may include glass, plastic, or metal or may include a plurality of frames or plates including any combination thereof. The housing HU may stably protect the components of the electronic device 1000 accommodated in the internal space thereof from an external impact.

Figure 3A:
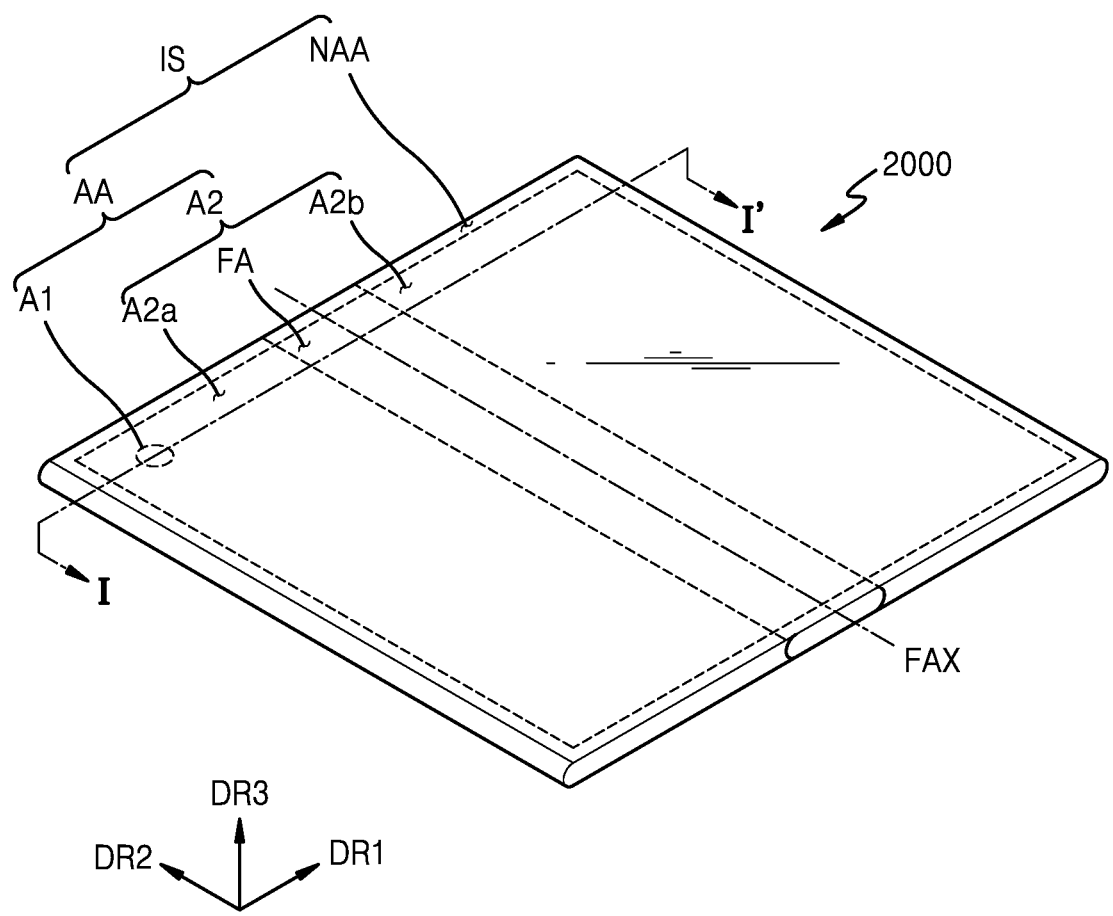
FIG. 3A is a perspective view schematically illustrating an electronic device according to an embodiment.
Figure 3B:
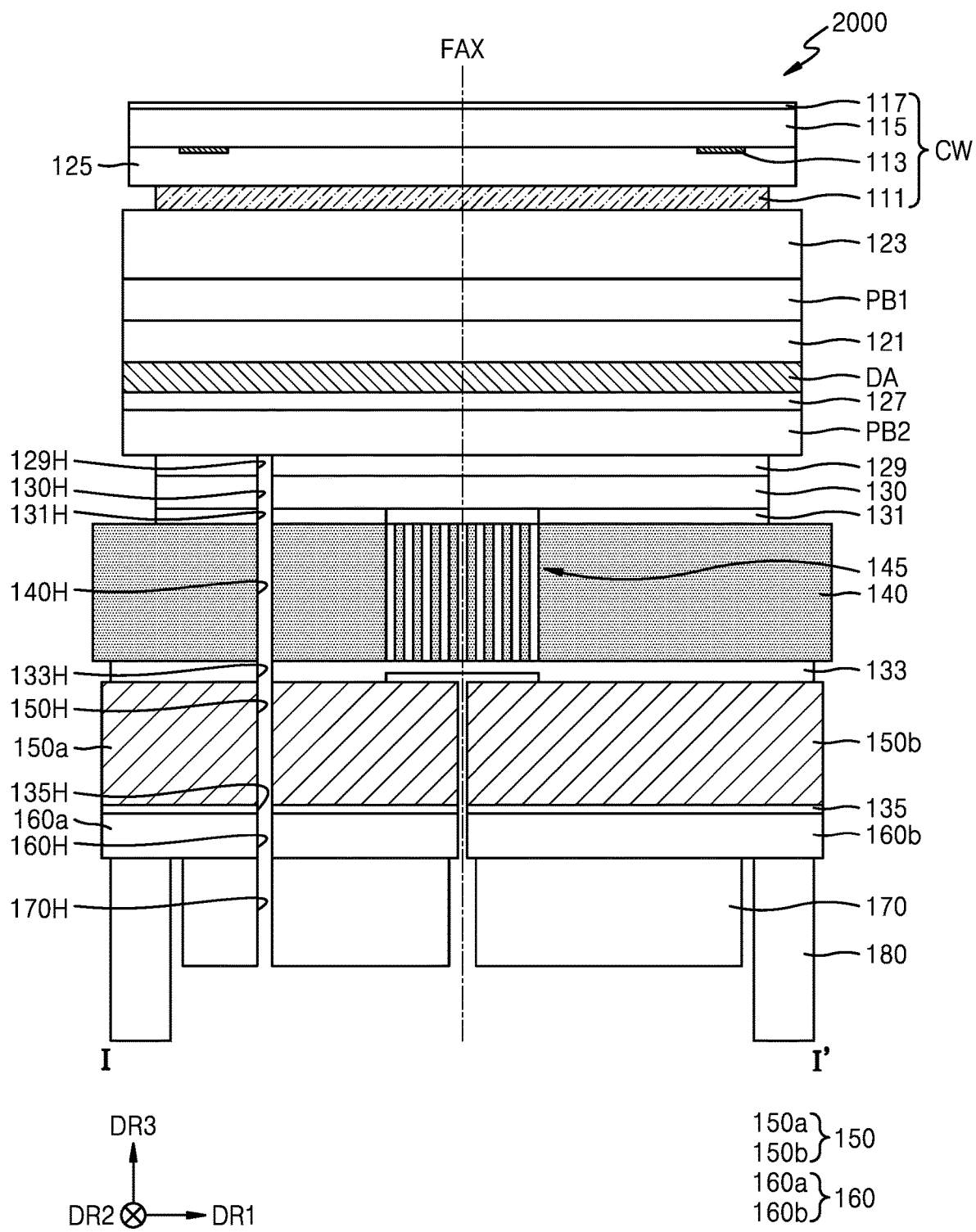
FIG. 3B is a cross-sectional view schematically illustrating an electronic device according to an embodiment.

FIG. 3A is a perspective view schematically illustrating an electronic device according to an embodiment, and FIG. 3B is a cross-sectional view schematically illustrating an electronic device according to an embodiment. FIG. 3A is a diagram illustrating a case where an electronic device 2000 is provided as a foldable electronic device 2000, and FIG. 3B is a diagram for describing the stack relationship of members constituting the electronic device 2000 and simply illustrates the members constituting the electronic device 2000.

Referring to FIG. 3A, in an embodiment, the electronic device 2000 may be a foldable electronic device 2000. The electronic device 2000 may be folded with respect to (or on) a folding axis FAX. For example, the electronic device 2000 may be folded on (or with respect to) the folding axis FAX. In an embodiment, a display surface IS of the electronic device 2000 may be located outside or inside the electronic device 2000.

The electronic device 2000 may include a housing, a display apparatus, and a cover window.

In an embodiment, the display apparatus may include an active area AA and a peripheral area NAA. The active area AA may be an area in which an image is displayed and simultaneously may be an area in which an external input is sensed. The active area AA may be an area in which a plurality of pixels described below are arranged.

The active area AA may include a first area A1 and a second area A2. Also, the second area A2 may include a first subarea A2a, a second subarea A2b, and a folding area FA. The first subarea A2a and the second subarea A2b may be respectively located on the left side and the right side with respect to (or on) the folding axis FAX, and the folding area FA may be located between the first subarea A2a and the second subarea A2b. However, the disclosure is not limited thereto.

Although FIG. 3A illustrates that the first area A1 is provided in a circular shape at the upper left end of the electronic device 2000, the disclosure is not limited thereto. The first area A1 may be provided in various numbers and shapes according to the number and shape of electronic modules SS (see FIG. 2A).

Also, although FIG. 3A illustrates that the first area A1 is adjacent to the first subarea A2a, the disclosure is not limited thereto. In an embodiment, the first area A1 may be located adjacent to the second subarea A2b.

Referring to FIG. 3B, in an embodiment, the electronic device 2000 may include a cover window CW, a first protection member PB1, a display apparatus DA, a second protection member PB2, a first support member 130, a second support member 140, a digitizer 150, a plate 160, a cushion layer 170, and a waterproof member 180.

The first protection member PB1 may be arranged on the display apparatus DA. The first protection member PB1 may be adhered to the upper surface of the display apparatus DA through a first adhesive layer 121. In this case, the first adhesive layer 121 may include a pressure sensitive adhesive (PSA). However, the disclosure is not limited thereto. The first adhesive layer 121 may include an optically clear adhesive (OCA).

The first protection member PB1 may be located over the display apparatus DA to protect the display apparatus DA from an external impact. The first protection member PB1 may include a polymer resin. For example, the first protection member PB1 may include a polymer resin such as polyether sulfone, polyacrylate, polyether imide, polyethylene naphthalate, polyethylene terephthalate, polyphenylene sulfide, polyarylate, polyimide, polycarbonate, or cellulose acetate propionate. However, the disclosure is not limited thereto. The first protection member PB1 may include a material such as glass or quartz.

The cover window CW may be arranged on the first protection member PB1. The cover window CW may be adhered to the upper surface of the first protection member PB1 through a second adhesive layer 123.

The cover window CW may include a window 111, an opaque layer 113, a window protection member 115, and a hard coating layer 117. The window 111 may include Ultra Thin Glass (UTG™). However, the disclosure is not limited thereto. The window 111 may include a polymer resin.

The window protection member 115 may be arranged over the window 111. The window protection member 115 may be adhered to the upper surface of the window 111 through a third adhesive layer 125. The window protection member 115 may protect the window 111 from an external impact and may prevent or minimize the occurrence of scratches on the upper surface of the window 111. The window protection member 115 may include a polymer resin. However, the disclosure is not limited thereto. The window protection member 115 may include an inorganic material.

The opaque layer 113 may be provided between the window protection member 115 and the third adhesive layer 125. However, the disclosure is not limited thereto. The opaque layer 113 may be provided at a portion of the window protection member 115. The opaque layer 113 may be formed of an opaque material such that the line or circuit of the display apparatus DA may not be identified from the outside. The portion where the opaque layer 113 is arranged may be a bezel area BZA.

The hard coating layer 117 may be on the window protection member 115. The hard coating layer 117 may include an organic material such as a polymer resin. However, the disclosure is not limited thereto. The hard coating layer 117 may include an inorganic material.

The hard coating layer 117 may be the outermost layer of the cover window CW. In this case, the outermost layer of the cover window CW may refer to the outermost layer of the electronic device 2000. The outermost layer of the cover window CW may be a layer directly touched by the user, and when the outermost layer of the cover window CW is Ultra Thin Glass (UTG™) or the window protection member 115, the user's touch feeling may be degraded. Because the hard coating layer 117 is provided as the outermost layer of the cover window CW, a smooth and soft touch feeling may be provided to the user.

The second protection member PB2 may be below the display apparatus DA. The second protection member PB2 may be adhered to the lower surface of the display apparatus DA through a fourth adhesive layer 127. The second protection member PB2 may be below the display apparatus DA to support the display apparatus DA and protect the display apparatus DA from an external impact. The second protection member PB2 may include a polymer resin such as polyethylene terephthalate or polyimide.

The first support member 130 may be arranged under the second protection member PB2. The first support member 130 may be adhered to the second protection member PB2 through a fifth adhesive layer 129. The first support member 130 may be located under the display apparatus DA to support the display apparatus DA. The first support member 130 may include a polymer resin such as polyethylene terephthalate or polyimide.

The second support member 140 may be below the first support member 130. The second support member 140 may be adhered to the first support member 130 through a sixth adhesive layer 131. In an embodiment, the sixth adhesive layer 131 may not be provided at a portion corresponding to the folding area FA (see FIG. 3A).

The second support member 140 may be located under the display apparatus DA to support the display apparatus DA. Also, the second support member 140 may be located over the digitizer 150 described below to protect the digitizer 150 from an external impact.

In an embodiment, the second support member 140 may include a folding structure 145. When the electronic device 2000 is folded, the folding structure 145 may vary in shape or may vary in length. For example, the folding structure 145 may include a pattern portion with an opening formed therein, may include an uneven shape, or may include links rotatably connected to each other. However, the disclosure is not limited thereto.

In an embodiment, when the electronic device 2000 is folded, the folding structure 145 may be folded with respect to (or on) the folding axis FAX. In an embodiment, the folding structure 145 may be provided such that both sides thereof are symmetrical with respect to (or on) the folding axis FAX. In an embodiment, the second support member 140 except the folding structure 145 may have a flat upper surface.

In an embodiment, the second support member 140 may include at least one of glass, plastic, and metal. In an embodiment, the second support member 140 may include polyurethane or may include carbon fiber reinforced plastic (CFRP). In an embodiment, the folding structure 145 may include the same material as the second support member 140 or may include a different material than the second support member 140.

The digitizer 150 may be below the second support member 140. The digitizer 150 may be adhered to the lower portion of the second support member 140 through a seventh adhesive layer 133. The seventh adhesive layer 133 may be located under the second support member 140 to prevent or minimize the inflow of foreign substances into the folding structure 145 of the second support member 140.

The digitizer 150 may include a body layer or a pattern layer. The digitizer 150 may sense a signal input from an external electronic pen or the like through the pattern layer. Particularly, the digitizer 150 may sense the strength, direction, or the like of a signal input from an electronic pen or the like.

When the digitizer 150 is integrally provided, a crack may occur in the body layer or the pattern layer of the digitizer 150 when the electronic device 2000 is folded. In an embodiment, the digitizer 150 may include a first digitizer 150a located on the left side with respect to (or on) the folding axis FAX and a second digitizer 150b located on the right side of the folding axis FAX. The first digitizer 150a may at least partially overlap the first subarea A2a of FIG. 3A, and the second digitizer 150b may at least partially overlap the second subarea A2b. Also, the first digitizer 150a may at least partially overlap the folding area FA (see FIG. 3A), and the second digitizer 150b may at least partially overlap the folding area FA (see FIG. 3A).

In an embodiment, the first digitizer 150a and the second digitizer 150b may be spaced apart from each other in the first direction DR1 with the folding axis FAX therebetween. That is, the digitizer 150 may be provided as a separate type rather than an integral type. Because the digitizer 150 is provided in a separate structure, the occurrence of cracks in the body layer or the pattern layer arranged in the folding area FA may be prevented or minimized.

Also, because the digitizer 150 is provided as a separate type and the digitizer 150 provided as a separate type is provided to at least partially overlap the folding area FA (see FIG. 3A), signals may also be received in the folding area FA and thus the user's convenience may be improved.

The plate 160 may be arranged under the digitizer 150. The plate 160 may be adhered to the lower surface of the digitizer 150 through an eighth adhesive layer 135. In an embodiment, the eighth adhesive layer 135 may not be provided at a portion corresponding to the folding area FA (see FIG. 3A).

The plate 160 may be configured to transmit heat generated in the digitizer 150 to the outside. In this case, the plate 160 may include a metal having high heat transmission efficiency. Alternatively, the plate 160 may include graphite having high thermal conductivity in the plane direction. When the plate 160 includes graphite, the plate 160 may have a smaller thickness than when the plate 160 includes metal. Also, the plate 160 may be arranged under the digitizer 150 to support the digitizer 150 and protect the digitizer 150 from an external impact.

The plate 160 may include a first plate 160a located on the left side with respect to (or on) the folding axis FAX and a second plate 160b located on the right side of the folding axis FAX.

The cushion layer 170 may be below the plate 160. The cushion layer 170 may prevent or minimize damage to the digitizer 150 arranged over the cushion layer 170 due to an external impact. In an embodiment, the cushion layer 170 may include a pressure sensitive adhesive.

The waterproof member 180 may be arranged outside the cushion layer 170. The waterproof member 180 may block or absorb moisture flowing in from outside the electronic device 2000 to prevent or minimize damage to the components of the electronic device 2000 due to the moisture. In this case, the waterproof member 180 may include a tape, a sponge, or the like.

In an embodiment, the fifth adhesive layer 129, the first support member 130, the sixth adhesive layer 131, the second support member 140, the seventh adhesive layer 133, the digitizer 150, the eighth adhesive layer 135, the plate 160, and the cushion layer 170 may respectively include through-holes 129H, 130H, 131H, 140H, 133H, 150H, 135H, 160H, and 170H corresponding to the first area A1. However, the disclosure is not limited thereto. At least one of the fifth adhesive layer 129, the first support member 130, the sixth adhesive layer 131, the second support member 140, the seventh adhesive layer 133, the digitizer 150, the eighth adhesive layer 135, the plate 160, and the cushion layer 170 may not include a through-hole. Also, although not illustrated, a through-hole may be additionally provided in the second protection member PB2.

Also, although FIG. 3B illustrates that the through-holes 129H, 130H, 131H, 140H, 133H, 150H, 135H, 160H, and 170H corresponding to the first area A1 are provided on the left side of the electronic device 2000, the disclosure is not limited thereto. In an embodiment, the through-holes 129H, 130H, 131H, 140H, 133H, 150H, 135H, 160H, and 170H corresponding to the first area A1 may be provided on the right side of the electronic device 2000.

Because the fifth adhesive layer 129, the first support member 130, the sixth adhesive layer 131, the second support member 140, the seventh adhesive layer 133, the digitizer 150, the eighth adhesive layer 135, the plate 160, and the cushion layer 170 respectively include the through-holes 129H, 130H, 131H, 140H, 133H, 150H, 135H, 160H, and 170H corresponding to the first area A1, the electronic device 1000 (see FIG. 2A) in which the light transmittance of the first area A1 is improved and thus the performance of the electronic module SS is improved may be provided.

Figure 4:
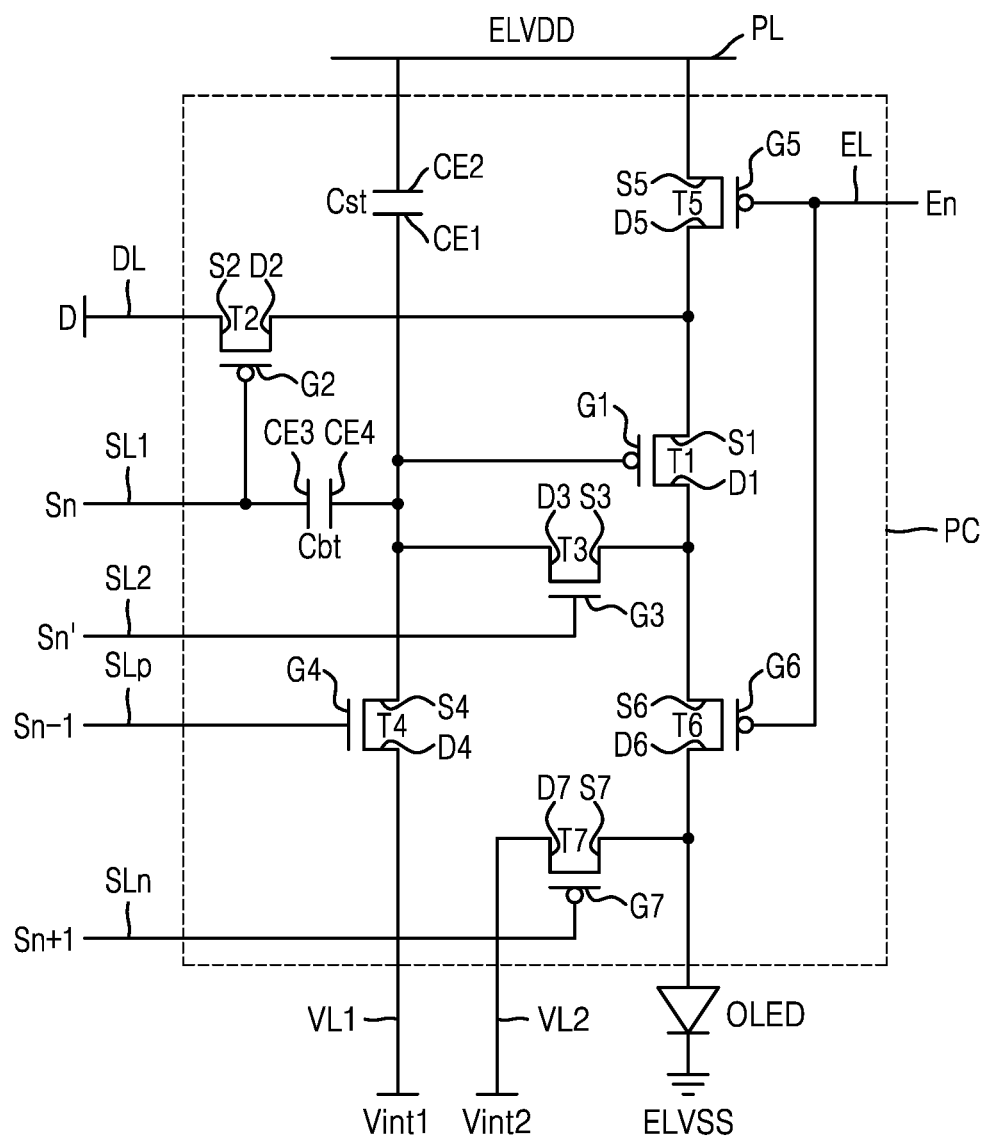
FIG. 4 is an equivalent circuit diagram of a pixel according to an embodiment.

FIG. 4 is an equivalent circuit diagram of a pixel according to an embodiment. Particularly, FIG. 4 is an equivalent circuit diagram of the pixel PX included in the display apparatus DA (see FIG. 2A). With only a difference in size, the equivalent circuit diagram of the pixel PX illustrated in FIG. 4 may be similarly applied to a second pixel PXm arranged in the second area A2, as well as to a first pixel PXa arranged in the first area A1.

In an embodiment, a pixel circuit PC may include a first transistor T1, a second transistor T2, a third transistor T3, a fourth transistor T4, a fifth transistor T5, a sixth transistor T6, a seventh transistor T7, a first storage capacitor Cst, and a second storage capacitor Cbt. In an embodiment, at least one of the first to seventh transistors T1 to T7 may be omitted.

The first to seventh transistors T1 to T7 and the first and second storage capacitors Cst and Cbt may be connected to signal lines, a first initialization voltage line VL1, a second initialization voltage line VL2, and a driving voltage line PL. The signal lines may include a data line DL, a first scan line SL1, a second scan line SL2, a previous scan line SLp, a next scan line SLn, and an emission control line EL. In an embodiment, the signal lines, the first and second initialization voltage lines VL1 and VL2, or the driving voltage line PL may be shared by adjacent pixels.

The driving voltage line PL may be configured to transmit a first power voltage ELVDD to the first transistor T1. The first initialization voltage line VL1 may be configured to transmit a first initialization voltage Vint1 for initializing the first transistor T1 to the pixel circuit PC. The second initialization voltage line VL2 may be configured to transmit a second initialization voltage Vint2 for initializing a light emitting device OLED to the pixel circuit PC.

For example, among the first to seventh transistors T1 to T7, the third transistor T3 and the fourth transistor T4 may be implemented as n-channel MOSFETs (NMOSs) and the others may be implemented as p-channel MOSFETs (PMOSs). However, the disclosure is not limited thereto. In an embodiment, the third transistor T3, the fourth transistor T4, and the seventh transistor T7 may be implemented as NMOSs and the others may be implemented as PMOSs).

Herein, "electrically connected between a transistor and a signal line or between a transistor and another transistor" may refer to "the source, drain, or gate of the transistor has an integral shape with the signal line or is connected through a connection electrode."

The first transistor T1 may be configured to control the level of a driving current flowing from the driving voltage line PL to the light emitting device OLED according to a gate voltage. The first transistor T1 may include a gate G1 connected to a first electrode CE1 of the first storage capacitor Cst, and a source S1 connected to the driving voltage line PL through the fifth transistor T5. Also, the first transistor T1 may include a drain D1 connected to the light emitting device OLED through the sixth transistor T6.

The second transistor T2 may be configured to receive a data voltage D in response to a first scan signal Sn. The second transistor T2 may be configured to transmit the data voltage D to the source S1 of the first transistor T1 in response to the first scan signal Sn. The second transistor T2 may include a gate G2 connected to the first scan line SL1, a source S2 connected to the data line DL, and a drain D2 connected to the source S1 of the first transistor T1.

The first storage capacitor Cst may be connected between the driving voltage line PL and the first transistor T1. The first storage capacitor Cst may include a second electrode CE2 connected to the driving voltage line PL, and a first electrode CE1 connected to the gate G1 of the first transistor T1. The first storage capacitor Cst may be configured to store the difference between the first power voltage ELVDD applied to the driving voltage line PL and the gate voltage of the first transistor T1 and may be configured to maintain the gate voltage of the first transistor T1.

The third transistor T3 may be connected in series between the drain D1 and the gate G1 of the first transistor T1 and may connect the drain D1 and the gate G1 of the first transistor T1 to each other in response to a second scan signal Sn'. The third transistor T3 may include a gate G3 connected to the second scan line SL2, a source S3 connected to the drain D1 of the first transistor T1, and a drain D3 connected to the gate G1 of the first transistor T1. The third transistor T3 may include a plurality of transistors that are connected in series to each other and are simultaneously controlled by the second scan signal Sn'. However, the third transistor T3 may be omitted.

When the third transistor T3 is turned on in response to the second scan signal Sn', the drain D1 and the gate G1 of the first transistor T1 may be connected to each other and thus the first transistor T1 may be diode-connected.

The fourth transistor T4 may be configured to apply the first initialization voltage Vint1 to the gate G1 of the first transistor T1 in response to a previous scan signal Sn−1. The fourth transistor T4 may include a gate G4 connected to the previous scan line SLp, a source S4 connected to the gate G1 of the first transistor T1, and a drain D4 connected to the first initialization voltage line VL1. The fourth transistor T4 may include a plurality of transistors that are connected in series to each other and are simultaneously controlled by the previous scan signal Sn−1. However, the fourth transistor T4 may be omitted.

The fifth transistor T5 may be configured to connect the driving voltage line PL and the source S1 of the first transistor T1 to each other in response to an emission control signal En. The fifth transistor T5 may include a gate G5 connected to the emission control line EL, a source S5 connected to the driving voltage line PL, and a drain D5 connected to the source S1 of the first transistor T1. However, the fifth transistor T5 may be omitted.

The sixth transistor T6 may be configured to connect the drain D1 of the first transistor T1 and the anode of the light emitting device OLED to each other in response to the emission control signal En. The sixth transistor T6 may be configured to transmit the driving current output from the first transistor T1 to the anode of the light emitting device OLED. The sixth transistor T6 may include a gate G6 connected to the emission control line EL, a source S6 connected to the drain D1 of the first transistor T1, and a drain D6 connected to the anode of the light emitting device OLED. However, the sixth transistor T6 may be omitted.

The seventh transistor T7 may be configured to apply the second initialization voltage Vint2 to the anode of the light emitting device OLED in response to a next scan signal Sn+1. The seventh transistor T7 may include a gate G7 connected to the next scan line SLn, a source S7 connected to the anode of the light emitting device OLED, and a drain D7 connected to the second initialization voltage line VL2. However, the seventh transistor T7 may be omitted.

The seventh transistor T7 may be connected to the next scan line SLn as illustrated in FIG. 4. Alternatively, the seventh transistor T7 may be connected to the emission control line EL and driven according to the emission control signal En. Alternatively, the seventh transistor T7 may be connected to the previous scan line SLp and driven according to the previous scan signal Sn−1.

Moreover, the positions of sources and drains may be interchanged depending on the types (p-type or n-type) of transistors.

The second storage capacitor Cbt may include a third electrode CE3 and a fourth electrode CE4. The fourth electrode CE4 of the second storage capacitor Cbt may be connected to the first electrode CE1 of the first storage capacitor Cst, and the third electrode CE3 of the second storage capacitor Cbt may be provided with the first scan signal Sn. The second storage capacitor Cbt may be configured to compensate for a voltage drop of the gate terminal of the first transistor T1 by increasing the voltage of the gate terminal of the first transistor T1 at the time when the provision of the first scan signal Sn is stopped. However, the second storage capacitor Cbt may be omitted.

Figure 5:
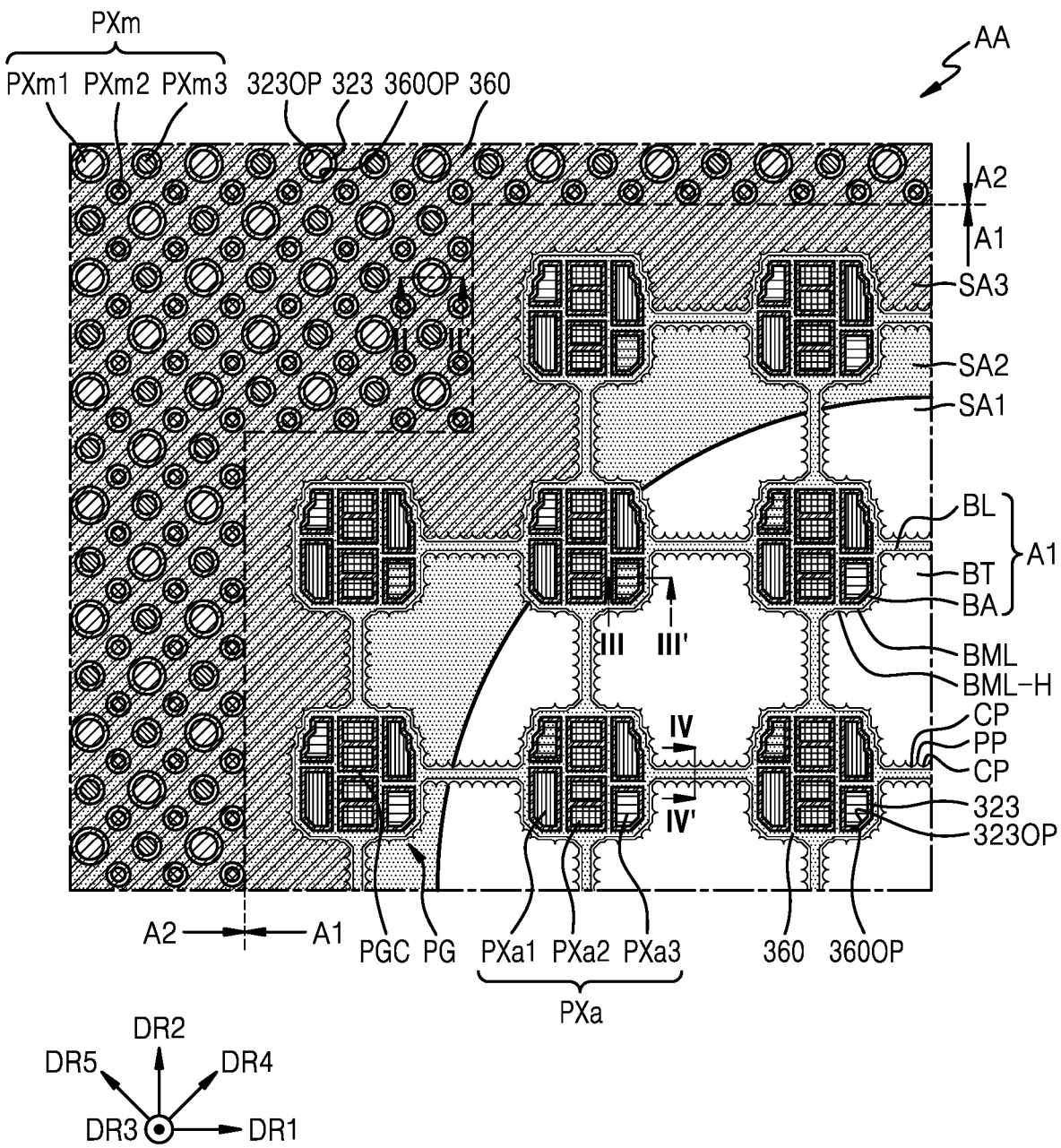
FIG. 5 is a plan view of an active area included in an electronic device according to an embodiment.
Figure 6:
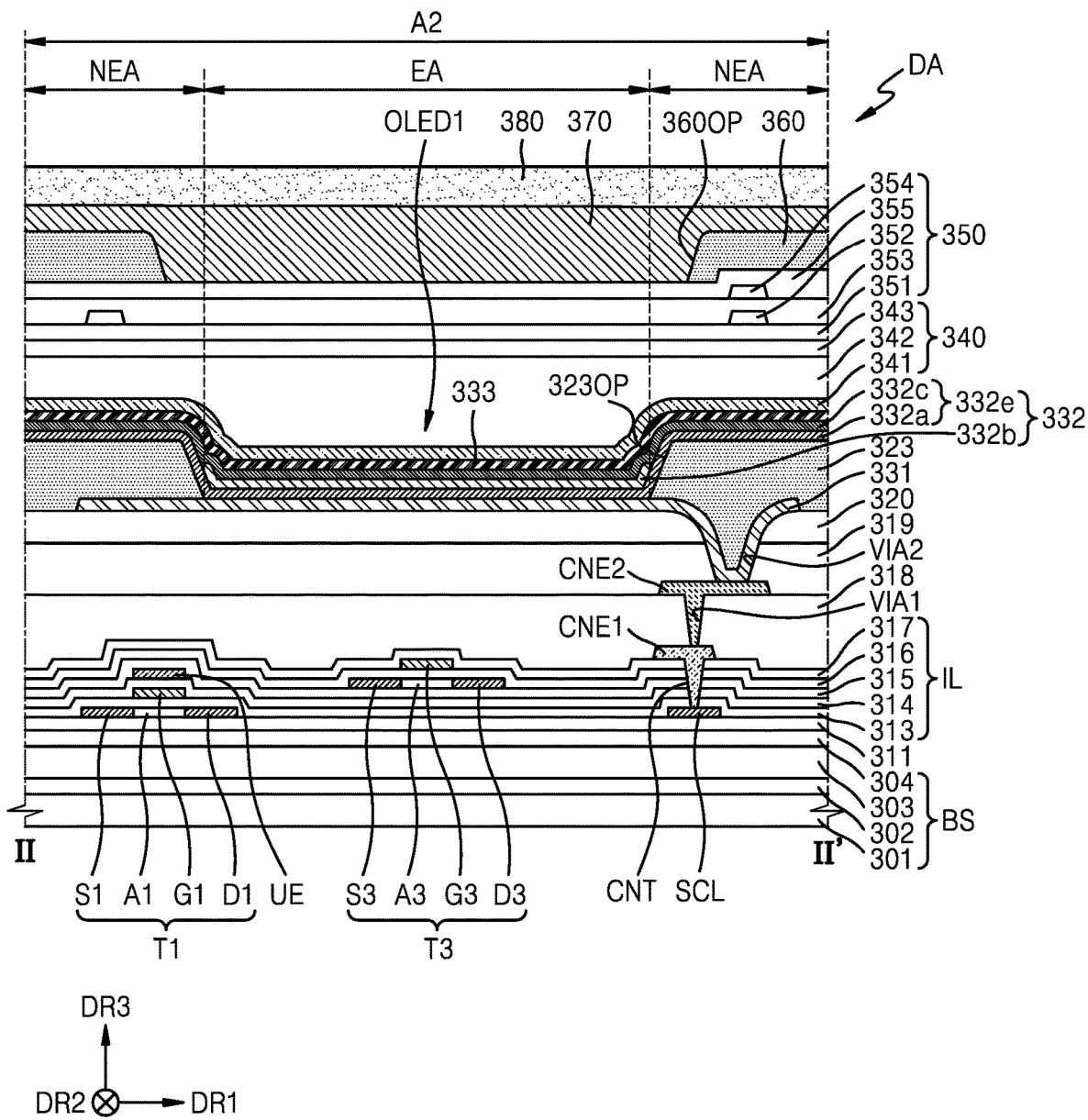
FIG. 6 is a cross-sectional view of an active area included in an electronic device according to an embodiment.
Figure 7:
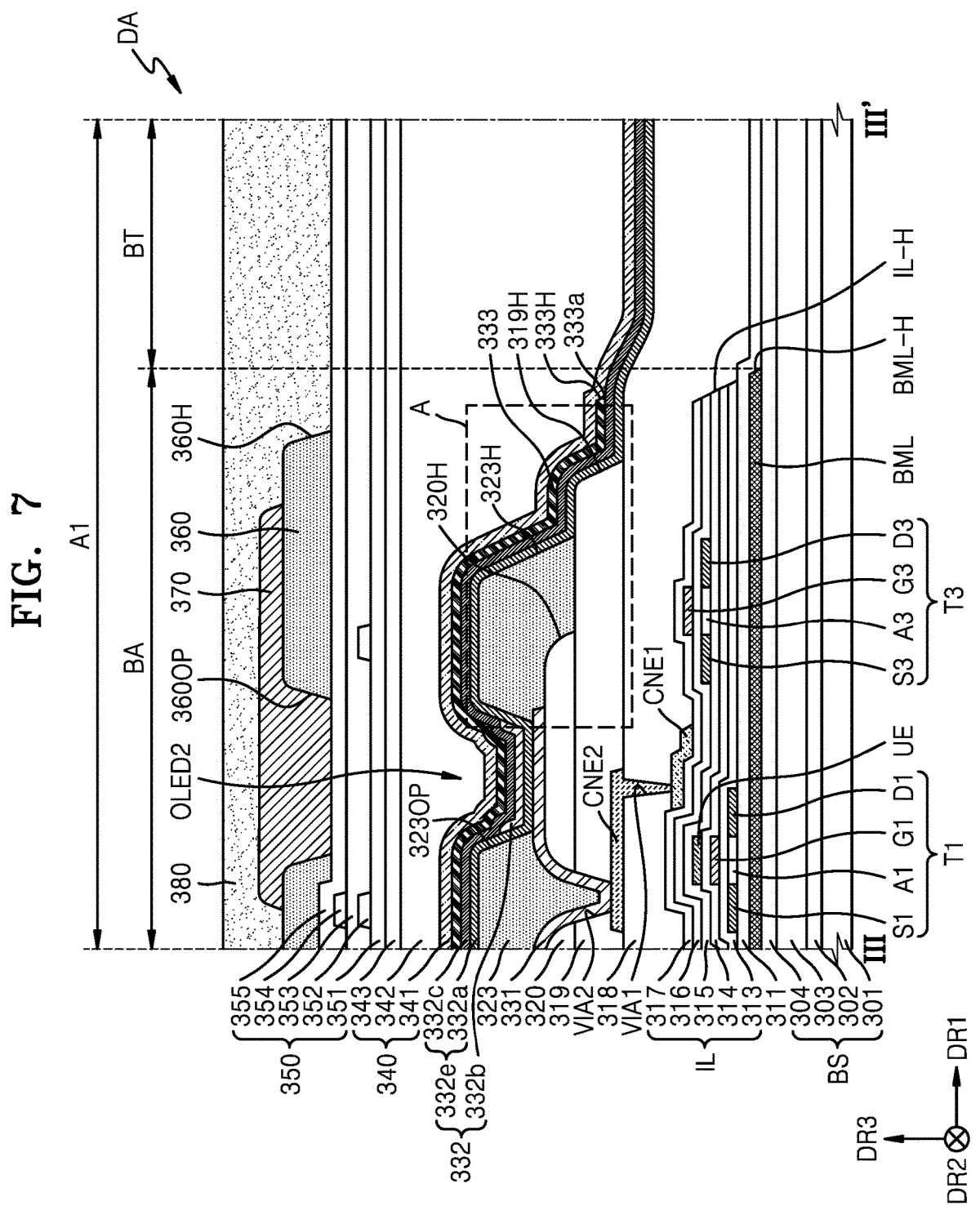

FIG. 5 is a plan view of an active area included in an electronic device according to an embodiment, FIG. 6 is a cross-sectional view of an active area included in an electronic device according to an embodiment, and FIG. 7 is a cross-sectional view of an active area included in an electronic device according to an embodiment. FIG. 6 is a cross-sectional view of the second area A2 taken along line II-II' of FIG. 5, and FIG. 7 is a cross-sectional view of the first area A1 taken along line III-III' of FIG. 5.

FIGS. 6 and 7 illustrate only the first transistor T1 and the third transistor T3 among the first to seventh transistors T1 to T7 illustrated in FIG. 4. However, the first transistor T1 and the third transistor T3 of FIG. 7 are illustrated to describe that the pixel PX includes a first semiconductor pattern including a silicon semiconductor and a second semiconductor pattern including an oxide semiconductor, and the positions of the first transistor T1 and the third transistor T3 are not limited to the positions illustrated in FIG. 7.

Referring to FIGS. 5, 6, and 7, the electronic device according to an embodiment may include a display apparatus, and the display apparatus may include a substrate BS, a light blocking layer BML, a first pixel PXa, a second pixel PXm, a pixel defining layer 323, and a black matrix 360.

In an embodiment, the substrate BS may include a first area A1 and a second area A2. In this case, because the display apparatus includes the substrate BS, it may be understood that the display apparatus includes the first area A1 and the second area A2.

In an embodiment, the first area A1 may include a display area BA, a line area BL, and a transmission area BT. Also, the first area A1 may include a first subarea SA1, a second subarea SA2, and a third subarea SA3. The first subarea SA1, the second subarea SA2, and the third subarea SA3 may be defined by the overlap relationship between the pixel defining layer 323 and the black matrix 360, and each of the first subarea SA1 and the second subarea SA2 may at least partially overlap the transmission area BT.

In an embodiment, the light blocking layer BML may be on the substrate BS. The light blocking layer BML may be on the display area BA and the line area BL of the first area A1. That is, the light blocking layer BML may overlap the display area BA and the line area BL of the first area A1 and may not overlap the transmission area BT of the first area A1.

In an embodiment, the light blocking layer BML may include a first hole BML-H corresponding to the transmission area BT. That is, the first hole BML-H may be defined in the light blocking layer BML. For example, the shape or size of the transmission area BT may be defined by the first hole BML-H defined in the light blocking layer BML.

In an embodiment, the edge of the light blocking layer BML may include a concave and convex uneven edge. For example, the edge of the light blocking layer BML may have a structure in which concave portions CP concaved in a direction away from the center of the transmission area BT are arranged adjacent to each other. The edge of the light blocking layer BML may include a structure in which a plurality of concave portions CP are continuously or regularly arranged, and a convex portion PP facing the center of the transmission area BT may be arranged between adjacent concave portions CP. In this case, this may be referred to as an EMBO structure. The EMBO structure (or embossed structure) may be a structure in which protrusions and/or indentations are formed on at least one surface.

In an embodiment, the convex portion PP may have a relatively pointed shape as illustrated in FIG. 5. However, the disclosure is not limited thereto. The convex portion PP may have a relatively rounded shape. In an embodiment, the concave portion CP may have a substantially semicircular shape. However, the disclosure is not limited thereto. For example, the concave portion CP may have various shapes such as a substantially semielliptical shape, a substantially triangular shape, or a substantially rectangular shape.

In an embodiment, because the edge of the light blocking layer BML is provided to include a plurality of concave portions CP and a plurality of convex portions PP, the diffraction of light propagating to the electronic module SS (see FIG. 2A) through the first hole BML-H defined in the light blocking layer BML may be minimized and thus the resolution of light received by the electronic module SS may be increased. For example, when the electronic module SS is provided as the camera module CMM (see FIG. 2B), because the edge of the light blocking layer BML is provided in the EMBO structure, the resolution of light received by the camera module CMM may be increased and thus the characteristics of the camera module CMM may be improved.

In an embodiment, the display apparatus may include a first pixel PXa and a second pixel PXm. The first pixel PXa may be arranged in the first area A1, and the second pixel PXm may be arranged in the second area A2. The first pixel PXa and the second pixel PXm may have different emission areas, and the first pixel PXa and the second pixel PXm may have different arrangement forms.

A plurality of first pixels PXa may be provided in the first area A1 and may be arranged apart from each other in the first direction DR1 or the second direction DR2. The first pixel PXa may include a plurality of subpixels PXa1, PXa2, and PXa3.

In an embodiment, the first pixel PXa may be arranged in the display area BA, and signal lines or voltage lines may be arranged in the line area BL. The transmission area BT may be an area having a higher light transmittance than the display area BA or the line area BL and may be defined as an area in which conductive patterns or insulating layers are patterned or undeposited in order to improve the light transmittance thereof. The transmission area BT of the first area A1 may be surrounded by the display area BA and the line area BL.

The transmission area BT may have various shapes. For example, the transmission area BT may have a polygonal shape in the plan view. Also, the transmission area BT may have a circular shape or an elliptical shape.

In the first area A1, display areas BA may be arranged apart from each other. Each display area BA may be surrounded by the transmission area BT, and subpixels emitting light of different colors, for example, a first subpixel PXa1, a second subpixel PXa2, and a third subpixel PXa3, may be arranged in the display area BA. In an embodiment, two first subpixels PXa1, four second subpixels PXa2, and two third subpixels PXa3 may be arranged in each display area BA. For example, two first subpixels PXa1, four second subpixels PXa2, and two third subpixels PXa3 may form one pixel group PG. In this case, the first subpixel PXa1 may emit blue light, the second subpixel PXa2 may emit green light, and the third subpixel PXa3 may emit red light.

The subpixels PXa1, PXa2, and PXa3 may be symmetrically arranged with respect to a center PGC of the pixel group PG. That is, in one display area BA, two first subpixels PXa1, four second subpixels PXa2, and two third subpixels PXa3 may be symmetrically arranged with respect to the center PGC. For example, two first subpixels PXa1 may be arranged apart from each other in a fourth direction DR4 with respect to the center PGC, and two third subpixels PXa3 may be arranged apart from each other in a fifth direction DR5 with respect to the center PGC. Also, four second subpixels PXa2 may be arranged apart from each other in the second direction DR2.

In an embodiment, the length of the first subpixel PXa1 in the second direction DR2 may be greater than the length of the third subpixel PXa3 in the second direction DR2. In an embodiment, the emission area of the first subpixel PXa1 may be greater than the emission area of the third subpixel PXa3, and the emission area of the third subpixel PXa3 may be greater than the emission area of the second subpixel PXa2. However, the disclosure is not limited thereto.

In an embodiment, the first subpixel PXa1, the second subpixel PXa2, and the third subpixel PXa3 may be substantially rectangular in the plan view. For example, the first subpixel PXa1 and the third subpixel PXa3 may have a rectangular shape having a short side in the first direction DR1 and a long side in the second direction DR2, and the second subpixel PXa2 may have a rectangular shape having a long side in the first direction DR1 and a short side in the second direction DR2. However, the disclosure is not limited thereto.

In an embodiment, at least one of the first subpixel PXa1, the second subpixel PXa2, and the third subpixel PXa3 may have an n-gonal shape ("n" is a natural number equal to or greater than 5) in the plan view. For example, the second subpixel PXa2 may have a rectangular shape, but edges of the first subpixel PXa1 and the third subpixel PXa3 adjacent to the transmission area BT may be bent at least once and thus the first subpixel PXa1 and the third subpixel PXa3 may have an n-gonal shape ("n" is a natural number equal to or greater than 5) in the plan view.

A plurality of second pixels PXm may be provided in the second area A2 and may be arranged apart from each other in the fourth direction DR4 or the fifth direction DR5. The second pixel PXm may include a plurality of subpixels PXm1, PXm2, and PXm3.

A (2-1)th subpixel PXm1, a (2-2)th subpixel PXm2, and a (2-3)th subpixel PXm3 may be arranged in the second area A2 according to a certain rule. For example, the (2-1)th subpixel PXm1, the (2-2)th subpixel PXm2, and the (2-3)th subpixel PXm3 may be arranged in a pentile (PenTile™) type.

For example, the (2-1)th subpixel PXm1 and the (2-2)th subpixel PXm2 adjacent to each other may be arranged apart from each other in the fifth direction DR5, and the (2-3)th subpixel PXm3 and the (2-2)th subpixel PXm2 adjacent to each other may be arranged apart from each other in the fourth direction DR4. Also, the (2-1)th subpixel PXm1 and the (2-3)th subpixel PXm3 may be alternately arranged in the first direction DR1 or the second direction DR2.

Each of the (2-1)th subpixel PXm1, the (2-2)th subpixel PXm2, and the (2-3)th subpixel PXm3 may have a circular shape. However, the disclosure is not limited thereto. For example, at least one of the (2-1)th subpixel PXm1, the (2-2)th subpixel PXm2, and the (2-3)th subpixel PXm3 may have a square shape, a rectangular shape, or a rhombus shape.

In an embodiment, the pixel defining layer 323 may be arranged over the substrate BS. The pixel defining layer 323 may be on the first area A1 and the second area A2. However, as described below, the pixel defining layer 323 may not be arranged in the line area BL, the first subarea SA1, and the second subarea SA2.

In an embodiment, the pixel defining layer 323 may include a first opening 323OP defining an emission area of each of the pixels PXa and PXm. That is, the emission area of each of the pixels PXa and PXm may be defined by the first opening 323OP defined in the pixel defining layer 323. For example, an emission area of each of the subpixels PXa1, PXa2, PXa3, PXm1, PXm2, and PXm3 may be defined by the first opening 323OP defined in the pixel defining layer 323.

In an embodiment, the black matrix 360 may be on the pixel defining layer 323. The pixel defining layer 323 and the black matrix 360 may at least partially overlap each other in the third direction DR3 that is perpendicular to the substrate BS. The black matrix 360 may be on the first area A1 and the second area A2. However, as described below, the black matrix 360 may not be arranged in the first subarea SAL In an embodiment, the black matrix 360 may include a second opening 360OP overlapping the first opening 323OP defined in the pixel defining layer 323. That is, the second opening 360OP may be defined in the black matrix 360, and the second opening 360OP defined in the black matrix 360 may at least partially overlap the first opening 323OP defined in the pixel defining layer 323. In an embodiment, the area of the second opening 360OP defined in the black matrix 360 may be greater than the area of the first opening 323OP defined in the pixel defining layer 323. However, the disclosure is not limited thereto. The area of the second opening 360OP defined in the black matrix 360 may be equal to the area of the first opening 323OP defined in the pixel defining layer 323, or the area of the second opening 360OP may be less than the area of the first opening 323OP.

In an embodiment, as described above, the first area A1 may include a first subarea SA1, a second subarea SA2, and a third subarea SA3. In an embodiment, the first subarea SA1 and the second subarea SA2 may overlap the transmission area BT. For example, it may be understood that the transmission area BT includes the first subarea SA1 and the second subarea SA2.

In an embodiment, the first subarea SA1 may be an area in which both the pixel defining layer 323 and the black matrix 360 are not arranged. The second subarea SA2 may be an area in which the pixel defining layer 323 is not arranged and the black matrix 360 is arranged. The third subarea SA3 may be an area in which both the pixel defining layer 323 and the black matrix 360 are arranged. For example, the pixel defining layer 323 and the black matrix 360 may overlap each other in the third subarea SA3 and may not overlap each other in the first subarea SA1 and the second subarea SA2. Because both the pixel defining layer 323 and the black matrix 360 are not arranged in the first subarea SA1, the light transmittance of the first subarea SA1 may be higher than the light transmittance of the second subarea SA2 and the third subarea SA3.

Referring to FIGS. 5 and 6, in an embodiment, the electronic device may include a display apparatus DA, and the display apparatus DA may include a substrate BS, a buffer layer 311, insulating layers IL, a light emitting device OLED1, an encapsulation member 340, an input sensor 350 (corresponding to the input sensor ISS of FIG. 2B), a black matrix 360, a color filter 370, and an overcoat layer 380.

The substrate BS may have a structure in which layers including organic materials and layers including inorganic materials are alternately stacked. For example, the substrate BS may include a first base layer 301, a first barrier layer 302, a second base layer 303, and a second barrier layer 304 that are sequentially stacked.

The first base layer 301 may include an organic material. For example, the first base layer 301 may include any one of polyimide, polyethylene naphthalate, polyethylene terephthalate, polyarylate, polycarbonate, polyetherimide, and polyethersulfone.

The first barrier layer 302 may be arranged over the first base layer 301. The first barrier layer 302 may include an inorganic material. For example, the first barrier layer 302 may include silicon oxide, silicon oxynitride, silicon nitride, or amorphous silicon. In an embodiment, the first barrier layer 302 may include a first layer and a second layer, and the second layer may have a lower refractive index than the first layer. For example, the first layer may include silicon oxynitride, and the second layer may include silicon oxide having a lower refractive index than silicon oxynitride.

The second base layer 303 may be arranged over the first barrier layer 302. The second base layer 303 may include the same material as the first base layer 301. However, the disclosure is not limited thereto. The second base layer 303 may include a different material than the first base layer 301. In an embodiment, the thickness of the second base layer 303 may be less than the thickness of the first base layer 301.

The second barrier layer 304 may be arranged over the second base layer 303. The second barrier layer 304 may include an inorganic material. For example, the second barrier layer 304 may include silicon oxide, silicon oxynitride, or silicon nitride. In an embodiment, the second barrier layer 304 may include a first layer and a second layer, and the second layer may have a lower refractive index than the first layer. For example, the first layer may include silicon oxynitride, and the second layer may include silicon oxide having a lower refractive index than silicon oxynitride.

The buffer layer 311 may be arranged over the substrate BS. The buffer layer 311 may reduce or block the penetration of foreign materials, moisture, or external air from under the substrate BS. The buffer layer 311 may include an inorganic material such as silicon oxide, silicon oxynitride, or silicon nitride and may include a single layer or multiple layers including the above material.

A semiconductor pattern may be arranged over the buffer layer 311. Hereinafter, the semiconductor pattern directly arranged over the buffer layer 311 will be defined as a first semiconductor pattern. The first semiconductor pattern may include a silicon semiconductor. The first semiconductor pattern may include polysilicon. However, the disclosure is not limited thereto. The first semiconductor pattern may include amorphous silicon.

FIG. 6 illustrates only a portion of the first semiconductor pattern, and the first semiconductor pattern may be further arranged in another area of the pixel PX (see FIG. 4). The first semiconductor pattern may include a doped area and an undoped area. The doped area may be doped with N-type dopants or P-type dopants. A P-type transistor may include a doped area doped with P-type dopants.

The first transistor T1 may include a source S1, an active A1, and a drain D1. The source S1, the active A1, and the drain D1 of the first transistor T1 may be formed as the first semiconductor pattern. The source S1 and the drain D1 of the first transistor T1 may be spaced apart from each other with the active A1 of the first transistor T1 therebetween.

A connection signal line SCL may be further on the buffer layer 311. The connection signal line SCL may be connected to the drain D6 of the sixth transistor T6 (see FIG. 4) in the plan view. However, the connection signal line SCL may be omitted.

A first insulating layer 313 may be on the buffer layer 311. The first insulating layer 313 may cover the first semiconductor pattern. In an embodiment, the first insulating layer 313 may include an inorganic material such as silicon oxide, silicon oxynitride, or silicon nitride and may include a single layer or multiple layers including the above material.

The gate G1 of the first transistor T1 may be on the first insulating layer 313. The gate G1 may be a portion of a metal pattern. The gate G1 of the first transistor T1 may at least partially overlap the first semiconductor pattern arranged thereunder. For example, the gate G1 may overlap the active A1 arranged thereunder. The gate G1 may include a low-resistance conductive material such as molybdenum (Mo), aluminum (Al), copper (Cu), or titanium (Ti) and may include a single layer or multiple layers including the above material.

A second insulating layer 314 may be on the first insulating layer 313. The second insulating layer 314 may cover the gate G1 of the first transistor T1 arranged over the first insulating layer 313. The second insulating layer 314 may include an inorganic material such as silicon oxide, silicon oxynitride, or silicon nitride and may include a single layer or multiple layers including the above material.

An upper electrode UE may be on the second insulating layer 314. The upper electrode UE may at least partially overlap the gate G1 of the first transistor T1 arranged thereunder. The upper electrode UE may be a portion of a metal pattern or may be a portion of a doped semiconductor pattern. A portion of the gate G1 and the upper electrode UE overlapping the same may form the first storage capacitor Cst (see FIG. 4). However, the upper electrode UE may be omitted.

Although not separately illustrated, the first electrode CE1 (see FIG. 4) and the second electrode CE2 (see FIG. 4) of the first storage capacitor Cst (see FIG. 4) may be formed through the same process as the gate G1 and the upper electrode UE respectively. The first electrode CE1 may be on the first insulating layer 313, and the first electrode CE1 may be electrically connected to the gate G1. The first electrode CE1 may have an integral shape with the gate G1.

A third insulating layer 315 may be on the second insulating layer 314. The third insulating layer 315 may cover the upper electrode UE arranged over the second insulating layer 314. The third insulating layer 315 may include an inorganic material such as silicon oxide, silicon oxynitride, or silicon nitride and may include a single layer or multiple layers including the above material. In an embodiment, the third insulating layer 315 may include a plurality of silicon oxide layers and silicon nitride layers that are alternately stacked.

Although not separately illustrated, the sources S2, S5, S6, and S7 (see FIG. 4), the drains D2, D5, D6, and D7 (see FIG. 4), and gates G2, G5, G6, and G7 (see FIG. 4) of the second, fifth, sixth, and seventh transistors T2, T5, T6, and T7 (see FIG. 4) may be formed through the same process as the source S1, the drain D1, and the gate G1 of the first transistor T1 respectively.

A semiconductor pattern may be on the third insulating layer 315. Hereinafter, the semiconductor pattern directly on the third insulating layer 315 will be defined as a second semiconductor pattern. The second semiconductor pattern may include an oxide semiconductor. The oxide semiconductor may include a crystalline or amorphous oxide semiconductor.

For example, the oxide semiconductor may include at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). Alternatively, the oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), or zinc-tin oxide (ZTO).

The third transistor T3 may include a source S3, an active A3, and a drain D3. The source S3, the active A3, and the drain D3 of the third transistor T3 may be formed as the second semiconductor pattern. The source S3 and the drain D3 of the third transistor T3 may include a metal reduced from a metal oxide semiconductor. The source S3 and the drain D3 of the third transistor T3 may have a certain thickness from the upper surface of the second semiconductor pattern and may include a metal layer including a reduced metal.

A fourth insulating layer 316 may be on the third insulating layer 315. The fourth insulating layer 316 may cover the second semiconductor pattern arranged over the third insulating layer 315. In an embodiment, the fourth insulating layer 316 may include an inorganic material such as silicon oxide, silicon oxynitride, or silicon nitride and may include a single layer or multiple layers including the above material.

In an embodiment, the fourth insulating layer 316 may be patterned to correspond to the gate G3 of the third transistor T3 arranged thereover. That is, the gate G3 and the fourth insulating layer 316 may have the same shape in the plan view.

The gate G3 of the third transistor T3 may be arranged over the fourth insulating layer 316. The gate G3 may be a portion of a metal pattern. The gate G3 of the third transistor T3 may at least partially overlap the second semiconductor pattern arranged thereunder. For example, the gate G3 may overlap the active A3 arranged thereunder. The gate G3 may include a low-resistance conductive material such as molybdenum (Mo), aluminum (Al), copper (Cu), or titanium (Ti) and may include a single layer or multiple layers including the above material.

A fifth insulating layer 317 may be on the fourth insulating layer 316. The fifth insulating layer 317 may cover the gate G3 arranged over the fourth insulating layer 316. In an embodiment, the fifth insulating layer 317 may include an inorganic material such as silicon oxide, silicon oxynitride, or silicon nitride and may include a single layer or multiple layers including the above material. In an embodiment, the fifth insulating layer 317 may include a plurality of silicon oxide layers and silicon nitride layers that are alternately stacked.

Although not separately illustrated, the source S4 (see FIG. 4), the drain D4 (see FIG. 4), and the gate G4 (see FIG. 4) of the fourth transistor T4 (see FIG. 4) may be formed through the same process as the source S3, the drain D3, and the gate G3 of the third transistor T3 respectively.

The first insulating layer 313 to the fifth insulating layer 317 may be collectively referred to as insulating layers IL. However, at least one insulating layer among the first insulating layer 313 to the fifth insulating layer 317 may be omitted.

At least one organic insulating layer may be on the fifth insulating layer 317. In an embodiment, a first organic insulating layer 318, a second organic insulating layer 319, and a third organic insulating layer 320 may be arranged over the fifth insulating layer 317. The first organic insulating layer 318, the second organic insulating layer 319, and the third organic insulating layer 320 may be a single-layer polyimide-based resin layer. However, the disclosure is not limited thereto. Each of the first organic insulating layer 318, the second organic insulating layer 319, and the third organic insulating layer 320 may include at least one of acryl-based resin, methacryl-based resin, polyisoprene, vinyl-based resin, epoxy-based resin, urethane-based resin, cellulose-based resin, siloxane-based resin, polyamide-based resin, and perylene-based resin.

A first connection electrode CNE1 may be on the fifth insulating layer 317. The first connection electrode CNE1 may be connected to the connection signal line SCL through a contact hole CNT defined in the first insulating layer 313 to the fifth insulating layer 317.

A second connection electrode CNE2 may be on the first organic insulating layer 318. The second connection electrode CNE2 may be connected to the first connection electrode CNE1 through a first via hole VIA1 defined in the first organic insulating layer 318.

The light emitting device OLED1 may be arranged over the third organic insulating layer 320. The light emitting device OLED1 may include a pixel electrode 331, an intermediate layer 332, and an opposite electrode 333. The pixel electrode 331 may be on the third organic insulating layer 320. Also, the pixel defining layer 323 may be on the third organic insulating layer 320.

The pixel electrode 331 may be on the third organic insulating layer 320. The pixel electrode 331 may be electrically connected to the second connection electrode CNE2 through a second via hole VIA2 defined in the second organic insulating layer 319 and the third organic insulating layer 320. The pixel electrode 331 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 331 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In an embodiment, the pixel electrode 331 may further include a layer formed of ITO, IZO, ZnO, or $In_2O_3$ over/under the reflective layer. For example, the pixel electrode 331 may have a multilayer structure of ITO/Ag/ITO.

The pixel defining layer 323 including the first opening 323OP exposing at least a portion of the pixel electrode 331 may be arranged over the pixel electrode 331. The first opening 323OP of the pixel defining layer 323 may define an emission area EA of light emitted from the light emitting device OLED1. For example, the width of the first opening 323OP may correspond to the width of the emission area EA. The periphery of the emission area EA may be a non-emission area NEA, and the non-emission area NEA may surround the emission area EA.

The pixel defining layer 323 may include an organic insulating material. Alternatively, the pixel defining layer 323 may include an inorganic insulating material such as silicon nitride, silicon oxynitride, or silicon oxide. Alternatively, the pixel defining layer 323 may include an organic insulating material and an inorganic insulating material. In an embodiment, the pixel defining layer 323 may include a light blocking material and may be provided in black. The light blocking material may include a resin or paste including carbon black, carbon nanotube, or black dye, metal particles (e.g., nickel, aluminum, molybdenum, or any alloy thereof), metal oxide particles (e.g., chromium oxide), or metal nitride particles (e.g., chromium nitride). When the pixel defining layer 323 includes the light blocking material, the reflection of external light by metal structures arranged under the pixel defining layer 323 may be reduced.

Although not illustrated, a spacer may be on the pixel defining layer 323. The spacer may include an organic insulating material such as polyimide. Alternatively, the spacer may include an inorganic insulating material such as silicon nitride ($SiN_x$) or silicon oxide ($SiO_2$) or may include an organic insulating material and an inorganic insulating material.

In an embodiment, the spacer may include the same material as the pixel defining layer 323. In this case, the pixel defining layer 323 and the spacer may be formed together in a mask process using a halftone mask. In an embodiment, the spacer may include a different material than the pixel defining layer 323.

The intermediate layer 332 may be on the pixel electrode 331. The intermediate layer 332 may include a first functional layer 332a, an emission layer 332b, and a second functional layer 332c that are sequentially stacked. The first functional layer 332a and the second functional layer 332c may be collectively referred to as an organic functional layer 332e.

The emission layer 332b may be arranged in the first opening 323OP of the pixel defining layer 323. The emission layer 332b may include a high-molecular or low-molecular weight organic material for emitting light of a certain color.

The organic functional layer 332e may include at least one of the first functional layer 332a between the pixel electrode 331 and the emission layer 332b and the second functional layer 332c between the emission layer 332b and the opposite electrode 333. For example, the first functional layer 332a may be arranged between the pixel electrode 331 and the emission layer 332b, and the second functional layer 332c may be omitted between the emission layer 332b and the opposite electrode 333. In an embodiment, the first functional layer 332a between the pixel electrode 331 and the emission layer 332b may be omitted, and the second functional layer 332c may be arranged between the emission layer 332b and the opposite electrode 333. In an embodiment, the first functional layer 332a may be arranged between the pixel electrode 331 and the emission layer 332b, and the second functional layer 332c may be arranged between the emission layer 332b and the opposite electrode 333. Hereinafter, a case where each of the first functional layer 332a and the second functional layer 332c is arranged will be mainly described in detail.

The first functional layer 332a may include, for example, a hole transport layer (HTL) or may include an HTL and a hole injection layer (HIL). The second functional layer 332c may include an electron transport layer (ETL) or an electron injection layer (EIL). The first functional layer 332a or the second functional layer 212c may be a common layer formed to entirely cover the substrate BS.

The opposite electrode 333 may include a conductive material having a low work function. For example, the opposite electrode 333 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 333 may further include a layer such as ITO, IZO, ZnO, or $In_2O_3$ over the (semi)transparent layer including the above material.

Although not illustrated, a capping layer may be further on the opposite electrode 333. The capping layer may include LiF, an inorganic material, or an organic material.

An encapsulation member may be on the light emitting device OLED1. The encapsulation member may include a thin film encapsulation layer 340. In the present embodiment, a case where the thin film encapsulation layer 340 is provided as the encapsulation member is illustrated; however, the disclosure is not limited thereto. The encapsulation member may be provided as an encapsulation substrate.

The thin film encapsulation layer 340 may include at least one inorganic layer and at least one organic layer. For example, the thin film encapsulation layer 340 may include a first inorganic layer 341, an organic layer 342, and a second inorganic layer 343 that are sequentially stacked.

The first inorganic layer 341 may be directly on the opposite electrode 333. The first inorganic layer 341 may prevent or minimize the penetration of external moisture or oxygen into the light emitting device OLED1.

The organic layer 342 may be directly on the first inorganic layer 341. The organic layer 342 may provide a flat surface over the first inorganic layer 341. Curves or particles formed on the upper surface of the first inorganic layer 341 may be covered by the organic layer 342 and thus the influence of the surface state of the upper surface of the first inorganic layer 341 on the components formed over the organic layer 342 may be blocked.

The second inorganic layer 343 may be directly on the organic layer 342. The second inorganic layer 343 may prevent or minimize the discharge of moisture or the like released from the organic layer 342 to the outside.

The first inorganic layer 341 and the second inorganic layer 343 may include one or more inorganic materials among aluminum oxide, titanium oxide, tantalum oxide, hafnium oxide, zinc oxide, silicon oxide, silicon nitride, and silicon oxynitride. The first inorganic layer 341 and the second inorganic layer 343 may include a single layer or multiple layers including the above material. The organic layer 342 may include a polymer-based material. The polymer-based material may include acryl-based resin, epoxy-based resin, polyimide, polyethylene, or the like. In an embodiment, the organic layer 342 may include acrylate.

The input sensor 350 (the input sensor ISS of FIG. 2B) may be arranged over the encapsulation member. The input sensor 350 may include a plurality of conductive patterns 352 and 354, a first sensing insulating layer 351, a second sensing insulating layer 353, and a third sensing insulating layer 355.

The first sensing insulating layer 351 may be on the encapsulation member. Also, the first conductive patterns 352 may be on the first sensing insulating layer 351 and may be covered by the second sensing insulating layer 353. Also, the second conductive patterns 354 may be on the second sensing insulating layer 353 and may be covered by the third sensing insulating layer 355. Each of the first sensing insulating layer 351, the second sensing insulating layer 353, and the third sensing insulating layer 355 may include at least one of an inorganic material and an organic material.

Each of the conductive patterns 352 and 354 may have conductivity. Each of the conductive patterns 352 and 354 may include a single layer or multiple layers. Also, at least one of the conductive patterns 352 and 354 may include mesh lines in the plan view.

The mesh lines constituting the conductive patterns 352 and 354 may not overlap the emission layer 332b in the plan view. Thus, even when the input sensor 350 is directly formed over the display panel DP (see FIG. 2B), the light formed in the pixels PX of the display panel DP may be provided to the user without interference with the input sensor 350.

When the black matrix 360 is directly formed over the second conductive pattern 354, the second conductive pattern 354 may be damaged in the process of patterning the black matrix 360. Thus, because the third sensing insulating layer 355 is arranged between the second conductive pattern 354 and the black matrix 360, damage to the second conductive pattern 354 may be prevented or minimized.

The color filter 370 may be on the input sensor 350. The color filter 370 may at least partially overlap the emission layer 332b arranged thereunder. The color filter 370 may selectively transmit light corresponding to the light provided from the emission layer 332b. For example, when the emission layer 332b provides blue light, the color filter 370 may be a blue color filter transmitting blue light. Alternatively, when the emission layer 332b provides green light, the color filter 370 may be a green color filter transmitting green light. Alternatively, when the emission layer 332b provides red light, the color filter 370 may be a red color filter transmitting red light.

The color filter 370 may include polymer photosensitive resin and pigment or dye. For example, the color filter 370 overlapping the emission layer 332b providing blue light may include blue pigment or dye, the color filter 370 overlapping the emission layer 332b providing green light may include green pigment or dye, and the color filter 370 overlapping the emission layer 332b providing red light may include red pigment or dye.

However, the disclosure is not limited thereto, and the color filter 370 overlapping the emission layer 332b providing blue light may not include pigment or dye. In this case, the color filter 370 may be transparent and may include transparent photosensitive resin.

The black matrix 360 may be arranged between the color filters 370 providing different lights. The black matrix 360 may be a pattern having a black color and may be a grid-shaped matrix. The black matrix 360 may include a black component (black coloring agent). The black component may include black dye and black pigment. The black component may include a metal such as carbon black or chromium or an oxide thereof. In an embodiment, the black matrix 360 may include the same material as the pixel defining layer 323.

In an embodiment, the black matrix 360 may include a second opening 360OP overlapping the emission area EA of the light emitting device OLED1. The width of the second opening 360OP of the black matrix 360 may be equal to or greater than the width of the first opening 323OP of the pixel defining layer 323 or the emission area EA of the light emitting device OLED1. However, the disclosure is not limited thereto. In an embodiment, the color filter 370 may be located (or arranged) in the second opening 360OP defined in the black matrix 360.

The overcoat layer 380 may be on the color filter 370 and the black matrix 360. The overcoat layer 380 may be a transparent layer not having colors of the visible light band and may provide a flat upper surface while covering an uneven portion generated in the process of forming the color filter 370 and the black matrix 360. For example, the overcoat layer 380 may include a transparent organic material such as acryl-based resin.

Referring to FIGS. 5, 6, and 7, in an embodiment, the electronic device may include a display apparatus DA, and the display apparatus DA may include a substrate BS, a buffer layer 311, insulating layers IL, a light emitting device OLED2, an encapsulation member 340, an input sensor 350 (corresponding to the input sensor ISS of FIG. 2B), a black matrix 360, a color filter 370, and an overcoat layer 380.

The substrate BS may have a structure in which layers including organic materials and layers including inorganic materials are alternately stacked. For example, the substrate BS may include a first base layer 301, a first barrier layer 302, a second base layer 303, and a second barrier layer 304 that are sequentially stacked.

The buffer layer 311 may be on the substrate BS. The buffer layer 311 may be arranged not only in the display area BA but also in the transmission area BT.

A light blocking layer BML may be arranged between the substrate BS and the buffer layer 311. For example, the light blocking layer BML may be on the display area BA of the first area A1. That is, the light blocking layer BML may overlap the display area BA of the first area A1 and may not overlap the transmission area BT of the first area A1. In an embodiment, when the second barrier layer 304 is omitted, the light blocking layer BML may be arranged between the second base layer 303 and the buffer layer 311.

In an embodiment, the light blocking layer BML may include a first hole BML-H corresponding to the transmission area BT. For example, the shape or size of the transmission area BT may be defined by the first hole BML-H defined in the light blocking layer BML.

In an embodiment, the light blocking layer BML may prevent or minimize the influence of light, which propagates to the electronic module SS (see FIG. 2A) overlapping the first area A1 or is emitted from the electronic module SS, on components such as transistors. Also, the light blocking layer BML may prevent or minimize the visual recognition of conductive materials arranged over the substrate BS by external light to the electronic module SS. Thus, even when the electronic module SS is arranged inside the active area AA (see FIG. 2A), the electronic device 1000 (see FIG. 2A) with improved performance of the electronic module SS may be provided.

In an embodiment, the light blocking layer BML may include a first light blocking layer, a second light blocking layer, and a third light blocking layer that are sequentially stacked. The first light blocking layer, the second light blocking layer, and the third light blocking layer may include different materials. For example, the first light blocking layer may include amorphous silicon, the second light blocking layer may include silicon oxide, and the third light blocking layer may include a conductive metal such as aluminum (Al), platinum (Pt), palladium (Pd), silver (Ag), magnesium (Mg), gold (Au), nickel (Ni), neodymium (Nd), iridium (Jr), chromium (Cr), calcium (Ca), molybdenum (Mo), titanium (Ti), tungsten (W), or copper (Cu).

A ghost phenomenon or the like may occur because the external light reflected by the electronic module SS is reflected by the light blocking layer BML and again incident on the electronic module SS. In an embodiment, because the light blocking layer BML includes the first light blocking layer, the second light blocking layer, and the third light blocking layer, the external light reflected by the electronic module SS may destructively interfere in the light blocking layer BML and thus the occurrence of a ghost phenomenon or the like may be prevented or minimized.

In an embodiment, the transmission area BT may be formed by omitting the insulating layers overlapping the transmission area BT among the first insulating layer 313 to the fifth insulating layer 317. For example, at least one insulating layer among the first insulating layer 313 to the fifth insulating layer 317 may include a hole corresponding to the transmission area BT.

In an embodiment, when the first insulating layer 313 to the fifth insulating layer 317 are collectively referred to as insulating layers IL, the insulating layers IL may include a second hole IL-H corresponding to the transmission area BT. Because the insulating layers IL include the second hole IL-H corresponding to the transmission area BT, the light transmittance of the transmission area BT may be improved.

A first organic insulating layer 318, a second organic insulating layer 319, a third organic insulating layer 320, and a pixel defining layer 323 may be sequentially arranged over the display area BA of the first area A1. The second organic insulating layer 319, the third organic insulating layer 320, and the pixel defining layer 323 may respectively include a third hole 319H, a fourth hole 320H, and a fifth hole 323H corresponding to the transmission area BT.

When the first organic insulating layer 318 includes a hole corresponding to the transmission area BT, at least one of the second organic insulating layer 319, the third organic insulating layer 320, and the pixel defining layer 323 on the first organic insulating layer 318 may flow down to the transmission area BT due to the step between the display area BA and the transmission area BT. For example, the pixel defining layer 323 on the display area BA may flow down to the transmission area BT.

In an embodiment, the first organic insulating layer 318 may not include a hole corresponding to the transmission area BT. That is, the first organic insulating layer 318 may be arranged not only over the display area BA but also over the transmission area BT. Because the first organic insulating layer 318 is arranged not only over the display area BA but also over the transmission area BT, the flow-down of at least one of the second organic insulating layer 319, the third organic insulating layer 320, and the pixel defining layer 323 arranged over the first organic insulating layer 318 to the transmission area BT may be prevented or minimized.

Also, because the third hole 319H, the fourth hole 320H, and the fifth hole 323H corresponding to the transmission area BT are respectively defined in the second organic insulating layer 319, the third organic insulating layer 320, and the pixel defining layer 323, the light transmittance of the transmission area BT may be improved.

A first connection electrode CNE1 may be on the fifth insulating layer 317, and a second connection electrode CNE2 may be on the first organic insulating layer 318. Also, the light emitting device OLED2 including a pixel electrode 331, an intermediate layer 332, and an opposite electrode 333 may be on the pixel defining layer 323.

In an embodiment, the second connection electrode CNE2 may be electrically connected to the first connection electrode CNE1 through a first via hole VIA1 defined in the first organic insulating layer 318, and the pixel electrode 331 may be electrically connected to the second connection electrode CNE2 through a second via hole VIA2 defined in the second organic insulating layer 319 and the third organic insulating layer 320.

Although FIG. 7 illustrates that the first connection electrode CNE1 and the second connection electrode CNE2 overlap the first transistor T1, this is merely for convenience of description and the disclosure is not limited thereto. Also, although FIG. 7 illustrates that the first connection electrode CNE1 is arranged between the first transistor T1 and the third transistor T3, this is merely for convenience of description and the disclosure is not limited thereto.

In an embodiment, the organic functional layer 332e may include a first functional layer 332a and a second functional layer 332c, and the first functional layer 332a and the second functional layer 332c may be arranged not only over the display area BA but also over the transmission area BT.

In an embodiment, the opposite electrode 333 may be on the display area BA of the first area A1. The opposite electrode 333 may include a sixth hole 333H corresponding to the transmission area BT. Because the sixth hole 333H corresponding to the transmission area BT is defined in the opposite electrode 333, the light transmittance of the transmission area BT may be improved.

An encapsulation member, an input sensor 350, a black matrix 360, a color filter 370, and an overcoat layer 380 may be sequentially on the light emitting device OLED2.

The encapsulation member may include a thin film encapsulation layer 340, and the thin film encapsulation layer 340 may include a first inorganic layer 341, an organic layer 342, and a second inorganic layer 343 that are sequentially stacked. The first inorganic layer 341, the organic layer 342, and the second inorganic layer 343 may be arranged not only in the display area BA but also in the transmission area BT.

The input sensor 350 may include a plurality of conductive patterns 352 and 354, a first sensing insulating layer 351, a second sensing insulating layer 353, and a third sensing insulating layer 355. The first sensing insulating layer 351, the second sensing insulating layer 353, and the third sensing insulating layer 355 may be arranged not only in the display area BA but also in the transmission area BT.

The black matrix 360 including a second opening 360OP corresponding to the emission layer 332b may be on the input sensor 350, and the color filter 370 may be located in the second opening 360OP defined in the black matrix 360. The color filter 370 may also be on the upper surface of the black matrix 360. The black matrix 360 may be on the display area BA and may include a seventh hole 360H corresponding to the transmission area BT. Because the seventh hole 360H corresponding to the transmission area BT is defined in the black matrix 360, the light transmittance of the transmission area BT may be improved.

The overcoat layer 380 may be on the color filter 370 and the black matrix 360. The overcoat layer 380 may be arranged not only in the display area BA but also in the transmission area BT.

Figure 8:
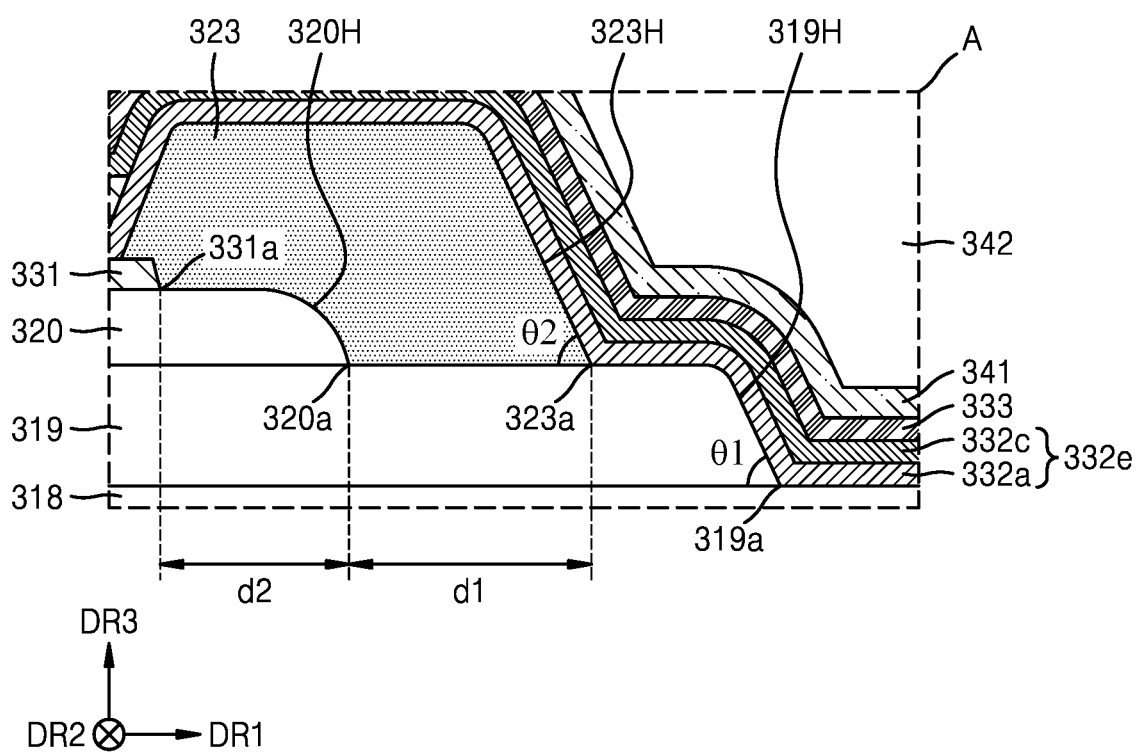
FIG. 8 is a cross-sectional view of an active area included in an electronic device according to an embodiment.

FIG. 8 is a cross-sectional view of an active area included in an electronic device according to an embodiment and is an enlarged view of region A of FIG. 7.

When an end portion 323a of the pixel defining layer 323 adjacent to the transmission area BT is located over the third organic insulating layer 320 or the end portion 323a of the pixel defining layer 323 adjacent to the transmission area BT and an end portion 320a of the third organic insulating layer 320 adjacent to the transmission area BT are located close to each other, at least a portion of the pixel defining layer 323 on the display area BA may flow down to the transmission area BT due to the step between the display area BA and the transmission area BT and thus a defect may occur. Thus, the end portion 323a of the pixel defining layer 323 adjacent to the transmission area BT and the end portion 320a of the third organic insulating layer 320 adjacent to the transmission area BT may be spaced apart from each other by a certain distance.

Referring to FIGS. 7 and 8, in an embodiment, the pixel defining layer 323 may cover the side surface of the third organic insulating layer 320 adjacent to the transmission area BT. The end portion 323a of the pixel defining layer 323 adjacent to the transmission area BT may be located closer to the transmission area BT than the end portion 320a of the third organic insulating layer 320 adjacent to the transmission area BT.

In the vertical cross-sectional view, a horizontal distance d1 between the end portion 320a of the third organic insulating layer 320 adjacent to the transmission area BT and the end portion 323a of the pixel defining layer 323 most adjacent to the end portion 320a of the third organic insulating layer 320 may be about 2 μm to about 8 μm. In this case, when the horizontal distance d1 is less than about 2 μm, because the end portion 323a of the pixel defining layer 323 and the end portion 320a of the third organic insulating layer 320 are located close to each other, at least a portion of the pixel defining layer 323 arranged over the display area BA may flow down to the transmission area BT due to the step between the display area BA and the transmission area BT and thus a defect may occur. On the other hand, when the horizontal distance d1 is greater than about 8 μm, because the distance between the end portion 320a of the third organic insulating layer 320 adjacent to the transmission area BT and an end portion 331a of the pixel electrode 331 adjacent to the transmission area BT decreases, a portion of the pixel electrode 331 may be formed to be inclined. When a portion of the pixel electrode 331 is formed to be inclined, a reflective color band may be formed in the display apparatus DA or the light emission efficiency of the display apparatus DA may be degraded.

Thus, because the horizontal distance d1 between the end portion 320a of the third organic insulating layer 320 adjacent to the transmission area BT and the end portion 323a of the pixel defining layer 323 most adjacent to the end portion 320a of the third organic insulating layer 320 is about 2 μm to about 8 μm in the vertical cross-sectional view, the occurrence of a defect due to the flow-down of at least a portion of the pixel defining layer 323 located over the display area BA to the transmission area BT due to the step between the display area BA and the transmission area BT may be prevented or minimized and simultaneously the inclined formation of the pixel electrode 331 may be prevented or minimized. In this case, in the vertical cross-sectional view, the horizontal distance d1 between the end portion 320a of the third organic insulating layer 320 adjacent to the transmission area BT and the end portion 323a of the pixel defining layer 323 most adjacent to the end portion 320a of the third organic insulating layer 320 may be about 3 μm to about 7 μm and may be about 4 μm to about 6 μm. Also, in the vertical cross-sectional view, the horizontal distance d1 between the end portion 320a of the third organic insulating layer 320 adjacent to the transmission area BT and the end portion 323a of the pixel defining layer 323 most adjacent to the end portion 320a of the third organic insulating layer 320 may be about 5 μm.

In an embodiment, the end portion 331a of the pixel electrode 331 adjacent to the transmission area BT may be located on the upper surface of the third organic insulating layer 320. When the end portion 331a of the pixel electrode 331 adjacent to the transmission area BT and the end portion 320a of the third organic insulating layer 320 adjacent to the transmission area BT are located close to each other, a portion of the pixel electrode 331 may be formed to be inclined. Thus, the end portion 331a of the pixel electrode 331 adjacent to the transmission area BT and the end portion 320a of the third organic insulating layer 320 adjacent to the transmission area BT may be spaced apart from each other by a certain distance.

In an embodiment, in the vertical cross-sectional view, a horizontal distance d2 between the end portion 320a of the third organic insulating layer 320 adjacent to the transmission area BT and the end portion 331a of the pixel electrode 331 most adjacent to the end portion 320a of the third organic insulating layer 320 may be about 3 μm to about 6 μm. In this case, when the horizontal distance d2 is less than about 3 μm, because the end portion 320a of the third organic insulating layer 320 and the end portion 331a of the pixel electrode 331 are located close to each other, a portion of the pixel electrode 331 the may be formed to be inclined. On the other hand, when the horizontal distance d2 is greater than about 6 μm, because the distance between the end portion 320a of the third organic insulating layer 320 and the end portion 331a of the pixel electrode 331 increases and thus the end portion 323a of the pixel defining layer 323 and the end portion 320a of the third organic insulating layer 320 are located close to each other, at least a portion of the pixel defining layer 323 arranged over the display area BA may flow down to the transmission area BT due to the step between the display area BA and the transmission area BT and thus a defect may occur.

Thus, because the horizontal distance d2 between the end portion 320a of the third organic insulating layer 320 adjacent to the transmission area BT and the end portion 331a of the pixel electrode 331 most adjacent to the end portion 320a of the third organic insulating layer 320 is about 3 μm to about 6 μm in the vertical cross-sectional view, the occurrence of a defect due to the flow-down of at least a portion of the pixel defining layer 323 located over the display area BA to the transmission area BT due to the step between the display area BA and the transmission area BT may be prevented or minimized and simultaneously the inclined formation of the pixel electrode 331 may be prevented or minimized.

In an embodiment, an end portion 319a of the second organic insulating layer 319 adjacent to the transmission area BT may be located on the upper surface (or the side surface) of the first organic insulating layer 318, and the end portion 323a of the pixel defining layer 323 adjacent to the transmission area BT may be located on the upper surface (or the side surface) of the second organic insulating layer 319. However, the disclosure is not limited thereto. The end portion 323a of the pixel defining layer 323 adjacent to the transmission area BT may be located on the upper surface (or the side surface) of the first organic insulating layer 318.

In an embodiment, a side surface 319H of the second organic insulating layer 319 adjacent to the transmission area BT may have a first angle θ1 with respect to a virtual line parallel to the horizontal plane of the substrate BS in the vertical cross-sectional view, and a side surface 323H of the pixel defining layer 323 adjacent to the transmission area BT may have a second angle θ2 with respect to a virtual line parallel to the horizontal plane of the substrate BS in the vertical cross-sectional view. In this case, because the horizontal plane of the substrate BS refers to a plane defined in the first direction DR1 and the second direction DR2 and the third direction DR3 refers to a direction perpendicular to the first direction DR1 and the second direction DR2, the virtual line parallel to the horizontal plane of the substrate BS may refer to a line extending in a direction perpendicular to the third direction DR3. Also, the first angle θ1 may refer to the angle between the side surface 319H of the second organic insulating layer 319 adjacent to the end portion 319a of the second organic insulating layer 319 and the virtual line parallel to the horizontal plane of the substrate BS, and the second angle θ2 may refer to the angle between the side surface 323H of the pixel defining layer 323 adjacent to the end portion 323a of the pixel defining layer 323 and the virtual line parallel to the horizontal plane of the substrate BS.

In an embodiment, the sum of the first angle θ1 and the second angle θ2 may be greater than about 20° and less than or equal to about 40°. In this case, when the sum of the first angle θ1 and the second angle θ2 is less than about 20°, at least a portion of the pixel defining layer 323 on the display area BA may flow down to the transmission area BT and thus a defect may occur. On the other hand, when the sum of the first angle θ1 and the second angle θ2 is greater than about 40°, a burr phenomenon in which an end portion 333a of the opposite electrode 333 is rolled up may occur. Thus, when the sum of the first angle θ1 and the second angle θ2 is greater than about 20° and less than or equal to about 40°, the occurrence of a defect due to the flow-down of at least a portion of the pixel defining layer 323 arranged over the display area BA to the transmission area BT may be prevented or minimized and the occurrence of a burr phenomenon in which the end portion 333a of the opposite electrode 333 is rolled up may be prevented or minimized.

In an embodiment, the second angle θ2 may be greater than or equal to about 20° and less than or equal to about 30°. In this case, when the second angle θ2 is less than about 20°, at least a portion of the pixel defining layer 323 arranged over the display area BA may flow down to the transmission area BT and thus a defect may occur. On the other hand, when the second angle θ2 is greater than about 40°, a burr phenomenon in which the end portion 333a of the opposite electrode 333 is rolled up may occur. Thus, when the second angle θ2 is greater than or equal to about 20° and less than or equal to about 40°, the occurrence of a defect due to the flow-down of at least a portion of the pixel defining layer 323 arranged over the display area BA to the transmission area BT may be prevented or minimized and the occurrence of a burr phenomenon in which the end portion 333a of the opposite electrode 333 is rolled up may be prevented or minimized.

Figure 9:
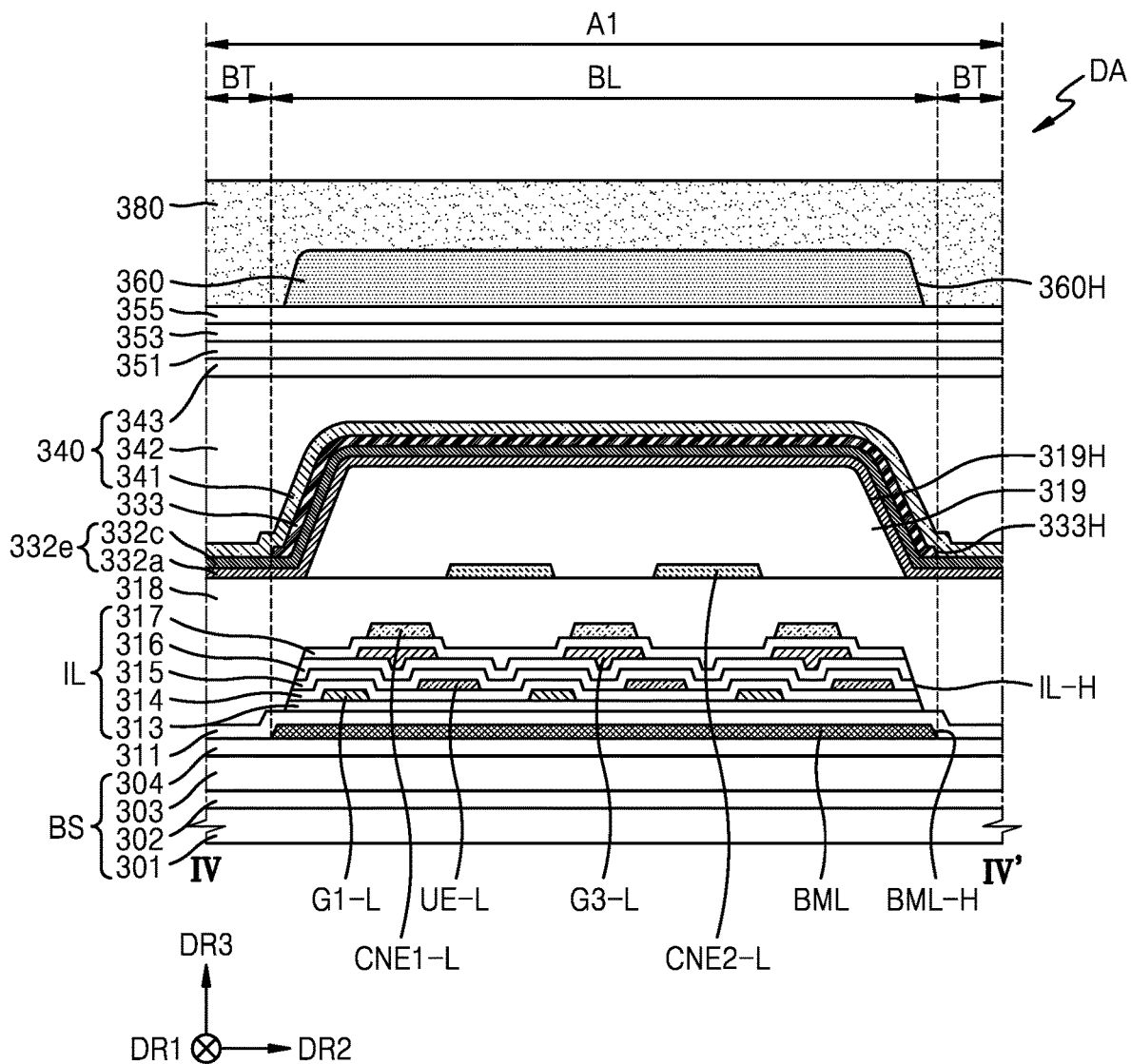
FIG. 9 is a cross-sectional view of an active area included in an electronic device according to an embodiment.

FIG. 9 is a cross-sectional view of an active area included in an electronic device according to an embodiment. FIG. 9 is a cross-sectional view of the first area A1 taken along line IV-IV' of FIG. 5.

Referring to FIGS. 5, 7, and 9, a light blocking layer BML, a first gate line G1-L, an upper electrode lines UE-L, a third gate line G3-L, a first connection electrode line CNE1-L, and a second connection electrode line CNE2-L may be arranged in the line area BL arranged between the transmission areas BT. The transmission area BT adjacent to the line area BL may have the same layer structure as the transmission area BT adjacent to the display area BA illustrated in FIG. 7.

The substrate BS may have a structure in which layers including organic materials and layers including inorganic materials are alternately stacked. For example, the substrate BS may include a first base layer 301, a first barrier layer 302, a second base layer 303, and a second barrier layer 304 that are sequentially stacked.

The light blocking layer BML may be arranged over the substrate BS. The light blocking layer BML arranged over the line area BL may have the structure described above with reference to FIG. 7. The buffer layer 311 may be arranged over the light blocking layer BML, and the first insulating layer 313 may be arranged over the buffer layer 311.

The first gate line G1-L may be arranged over the first insulating layer 313. The first gate lines G1-L may be arranged on the same layer and may include the same material as the gate G1 described above.

The second insulating layer 314 may be arranged over the first insulating layer 313, and the upper electrode line UE-L may be arranged over the second insulating layer 314. The upper electrode line UE-L may be arranged on the same layer and may include the same material as the upper electrode UE described above. In an embodiment, the first gate line G1-L and the upper electrode line UE-L may be spaced apart from each other in the cross-sectional view.

The third insulating layer 315 may be arranged over the second insulating layer 314, the fourth insulating layer 316 may be arranged over the third insulating layer 315, and the third gate line G3-L may be arranged over the fourth insulating layer 316. The third gate line G3-L may be arranged on the same layer and may include the same material as the gate G3 described above. In an embodiment, the third gate line G3-L may at least partially overlap each of the first gate line G1-L and the upper electrode line UE-L in the cross-sectional view.

The fifth insulating layer 317 may be arranged over the fourth insulating layer 316, and the first connection electrode lines CNE1-L may be arranged over the fifth insulating layer 317. The first connection electrode line CNE1-L may be arranged on the same layer and may include the same material as the first connection electrode CNE1 described above. In an embodiment, the first connection electrode line CNE1-L may at least partially overlap the third gate line G3-L in the cross-sectional view.

The first organic insulating layer 318 may be arranged over the fifth insulating layer 317, and the second organic insulating layer 319 may be arranged over the first organic insulating layer 318. The second connection electrode line CNE2-L may be arranged between the first organic insulating layer 318 and the second organic insulating layer 319. The second connection electrode line CNE2-L may be arranged on the same layer and may include the same material as the second connection electrode CNE2 described above.

In an embodiment, because some of the first gate line G1-L, the upper electrode line UE-L, the third gate line G3-L, the first connection electrode line CNE1-L, and the second connection electrode CNE2-L are arranged to overlap each other, the size (or area) of the transmission area BT may be increased and thus the light transmittance of the first area A1 including the transmission area BT may be improved.

Also, the first gate line G1-L, the upper electrode line UE-L, the third gate line G3-L, the first connection electrode line CNE1-L, and the second connection electrode line CNE2-L) may completely overlap the light blocking layer BML arranged over the substrate BS.

In an embodiment, the third organic insulating layer 320 or the pixel defining layer 323 may be arranged over the second organic insulating layer 319. However, the disclosure is not limited thereto.

The organic functional layer 332*e* including the first functional layer 332*a* and the second functional layer 332*c* may be arranged over the second organic insulating layer 319, the opposite electrode 333 may be arranged over the organic functional layer 332*e*, and the first inorganic layer 341, the organic layer 342, the second inorganic layer 343, the first sensing insulating layer 351, the second sensing insulating layer 353, and the third sensing insulating layer 355 may be sequentially arranged over the opposite electrode 333. However, the disclosure is not limited thereto.

In the related art, when the pixel defining layer 323 is on the first gate line G1-L, the upper electrode line UE-L, the third gate line G3-L, the first connection electrode line CNE1-L, and the second connection electrode line CNE2-L of the line area BL, a portion of the pixel defining layer 323 arranged over the line area BL may flow down to the transmission area BT due to the step between the line area BL and the transmission area BT.

In an embodiment, instead of the pixel defining layer 323, the black matrix 360 may be on the first gate line G1-L, the upper electrode line UE-L, the third gate line G3-L, the first connection electrode line CNE1-L, and the second connection electrode line CNE2-L of the line area BL. Thus, the pixel defining layer 323 may be provided in an isolated shape in the first area A1. That is, the pixel defining layer 323 may be arranged only in the display area BA of the first area A1.

In an embodiment, the black matrix 360 may be arranged over the third sensing insulating layer 355. In an embodiment, the black matrix 360 may at least partially overlap the first gate line G1-L, the upper electrode line UE-L, the third gate line G3-L, the first connection electrode line CNE1-L, and the second connection electrode line CNE2-L arranged thereunder. For example, the black matrix 360 may completely overlap the first gate line G1-L, the upper electrode line UE-L, the third gate line G3-L, the first connection electrode line CNE1-L, and the second connection electrode line CNE2-L arranged thereunder.

Because the black matrix 360 overlaps the first gate line G1-L, the upper electrode line UE-L, the third gate line G3-L, the first connection electrode line CNE1-L, and the second connection electrode line CNE2-L arranged thereunder, the reflection of external light may be prevented and the contrast of the display apparatus may be improved.

In an embodiment, holes BML-H, IL-H, 319H, and 360H corresponding to the transmission area BT may be respectively defined in the light blocking layer BML, the insulating layers IL, the second organic insulating layer 319, and the black matrix 360.

Figure 10:
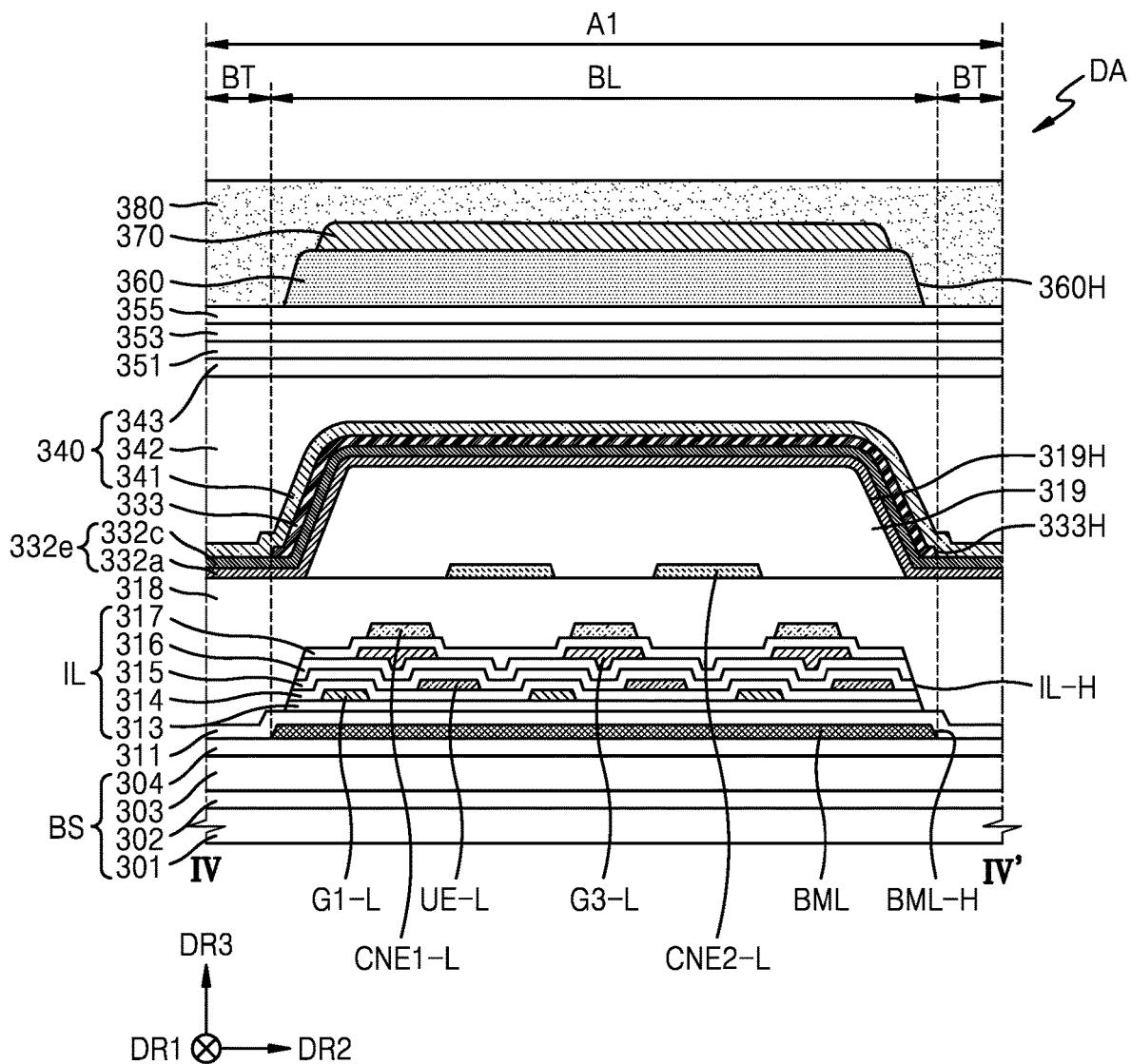
FIG. 10 is a cross-sectional view of an active area included in an electronic device according to an embodiment.

FIG. 10 is a cross-sectional view of an active area included in an electronic device according to an embodiment. The embodiment of FIG. 10 may be different from the embodiment of FIG. 9 in that a color filter is further arranged over a black matrix. In FIG. 10, like reference numerals as those in FIG. 9 will denote like members, and thus, redundant descriptions thereof will be omitted for conciseness.

Referring to FIG. 10, a color filter 370 may be further on the black matrix 360 of the line area BL of the first area A1. In an embodiment, the color filter 370 may at least partially overlap the first gate line G1-L, the upper electrode line UE-L, the third gate line G3-L, the first connection electrode line CNE1-L, and the second connection electrode line CNE2-L arranged thereunder. For example, the color filter

370 may completely overlap the first gate line G1-L, the upper electrode line UE-L, the third gate line G3-L, the first connection electrode line CNE1-L, and the second connection electrode line CNE2-L arranged thereunder.

In an embodiment, the color filter 370 may be a red color filter. However, the disclosure is not limited thereto. In an embodiment, the color filter 370 may be a green color filter or a blue color filter.

In an embodiment, because the color filter 370 is arranged over the line area BL of the first area A1, the black sense on the screen when the power of the electronic device is turned off may be improved.

Figure 11:
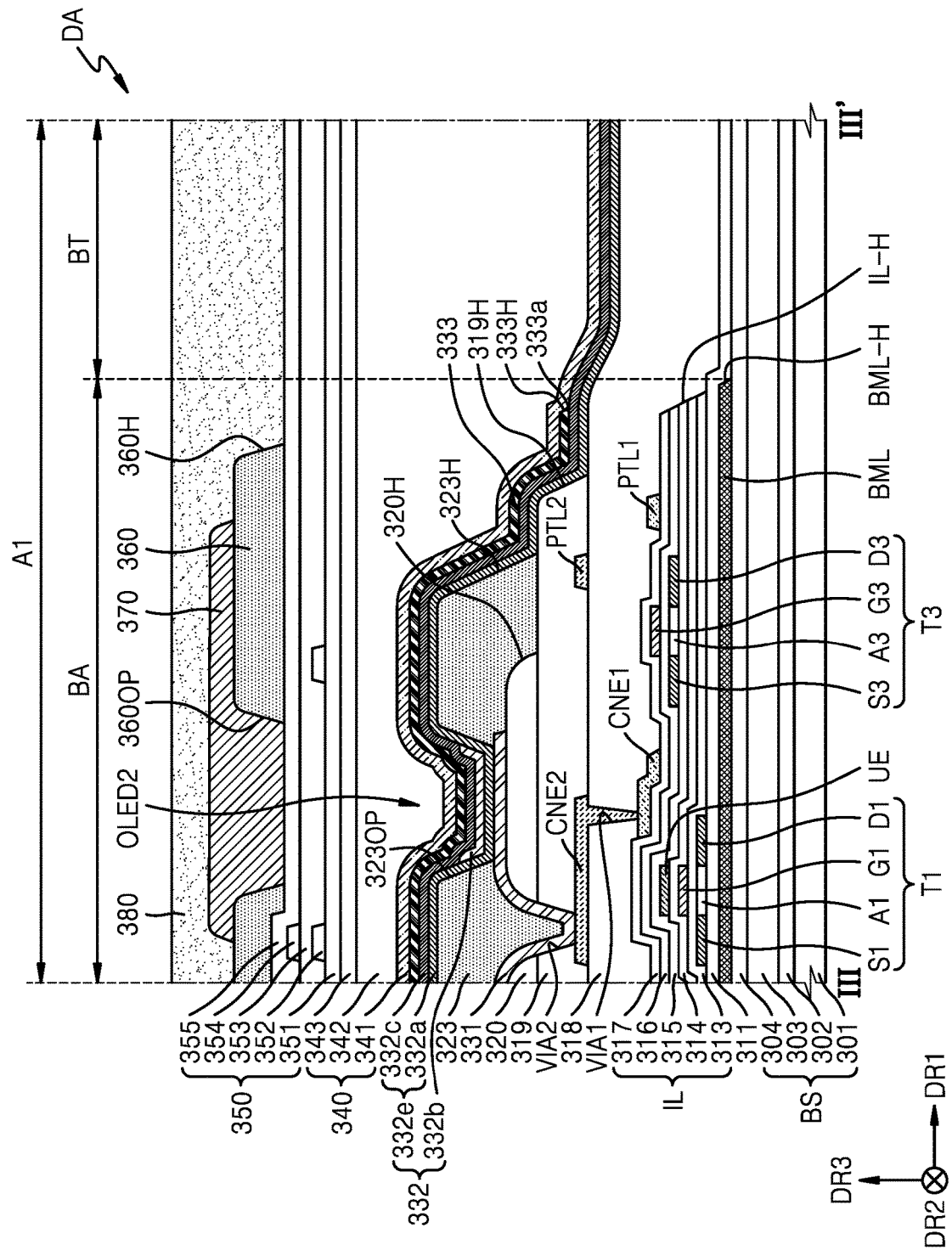
FIG. 11 is a cross-sectional view of an active area included in an electronic device according to an embodiment.

FIG. 11 is a cross-sectional view of an active area included in an electronic device according to an embodiment. The embodiment of FIG. 11 may be different from the embodiment of FIG. 7 in that protection patterns PTL1 and PTL2 are further on the substrate BS. In FIG. 11, like reference numerals as those in FIG. 7 will denote like members, and thus, redundant descriptions thereof will be omitted for conciseness.

Referring to FIGS. 7 and 11, protection patterns PTL1 and PTL2 may be further on the substrate BS. The protection patterns PTL1 and PTL2 may be arranged over the display area BA adjacent to the transmission area BT. The protection patterns PTL1 and PTL2 may be on the display area BA to surround the boundary of the transmission area BT.

The first protection pattern PTL1 may be on the fifth insulating layer 317. The first protection pattern PTL1 may overlap the first organic insulating layer 318 and the second organic insulating layer 319 arranged thereover. However, the disclosure is not limited thereto. The first protection pattern PTL1 may also be arranged between the insulating layers IL.

The second protection pattern PTL2 may be on the first organic insulating layer 318. The second protection pattern PTL2 may overlap the pixel defining layer 323 arranged thereover. However, the disclosure is not limited thereto. The second protection pattern PTL2 may be arranged over the second organic insulating layer 319.

Because the protection patterns PTL1 and PTL2 are on the display area BA adjacent to the transmission area BT, the delamination of the components arranged over the display area BA adjacent to the transmission area BT in the process of removing the opposite electrode 333 formed over the transmission area BT by using a laser beam may be prevented or minimized and thus the reliability of the display apparatus may be improved.

Although FIGS. 1 to 11 illustrate that the color filter 370 may be arranged over the black matrix 360, but the disclosure is not limited thereto. For example, a reflection control layer may be arranged over the black matrix 360. The reflection control layer may selectively absorb light of a certain band among pieces of light reflected from the inside of the display panel and/or the electronic device or pieces of light incident from the outside of the display panel and/or the electronic device.

FIGS. 6, 7, and 11 illustrate that the color filter 370 may be located (or arranged) in the second opening 360OP defined in the black matrix 360, but the disclosure is not limited thereto. For example, the reflection control layer may be located (or arranged) in the second opening 360OP defined in the black matrix 360.

For example, the reflection control layer may absorb a first wavelength band of about 490 nm to about 505 nm and a second wavelength band of about 585 nm to about 600 nm, so that light transmittance in the first wavelength band and the second wavelength band is about 40% or less. The reflection control layer may absorb light of wavelengths out of the wavelength ranges of red light, green light, and blue light respectively emitted from the first display element, the second display element, and the third display element. Because the reflection control layer absorbs light of wavelengths that do not belong to the wavelength ranges the red light, the green light, and the blue light emitted from the display elements, the reduction in the luminance of the display panel and/or the electronic device may be prevented or minimized. Also, the reduction in the luminescence efficiency of the display panel and/or the electronic device may be prevented or minimized, and the visibility of the display panel and/or the electronic device may be improved.

The reflection control layer may include an organic material layer including a dye, a pigment, and/or any combination thereof. The reflection control layer may include a tetraazaporphyrin (TAP)-based compound, a porphyrin-based compound, a metal porphyrin-based compound, an oxazine-based compound, a squarylium-based compound, a triarylmethane-based compound, a polymethine-based compound, a traquinone-based compound, a phthalocyanine-based compound, an azo-based compound, a perylene-based compound, a xanthene-based compound, a diimmonium-based compound, a dipyrromethene-based compound, a cyanine-based compound, and/or any combination thereof.

In an embodiment, the reflection control layer may have a transmittance of about 64% to about 72%. The transmittance of the reflection control layer may be controlled according to the amount of the pigment and/or the dye included in the reflection control layer. The reflection control layer overlaps the display elements in a plan view, but does not overlap the transmission area BT in a plan view. In a plan view, the transmission area BT may overlap the overcoat layer 380 without overlapping the reflection control layer.

According to the embodiment including the reflection control layer, a capping layer and a low reflection layer may be additionally between the opposite electrode 333 and the thin film encapsulation layer 340.

Due to the principle of constructive interference, the capping layer may improve the luminescence efficiency of the display element. The capping layer may include, for example, a material having a refractive index of about 1.6 or greater for light having a wavelength of about 589 nm.

The capping layer may be an organic capping layer including an organic material, an inorganic capping layer including an inorganic material, or a composite capping layer including an organic material and an inorganic material. For example, the capping layer may include a carbocyclic compound, a heterocyclic compound, an amine group-containing compound, porphine derivatives, phthalocyanine derivatives, naphthalocyanine derivatives, an alkali metal complex, an alkaline earth metal complex, and/or any combination thereof. The carbocyclic compound, the heterocyclic compound, and the amine group-containing compound may optionally be substituted with substituents including O, N, S, Se, Si, F, Cl, Br, I, and/or any combination thereof.

The low reflection layer may be on the capping layer. The low reflection layer may include an inorganic material having low reflectance. In an embodiment, the low reflection layer may include a metal or a metal oxide. When the low reflection layer includes a metal, the low reflection layer may include, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), and/or any combination thereof. Also, when the low reflection layer includes a metal oxide, the low reflection layer may include, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS, and/or any combination.

In an embodiment, the inorganic material included in the low reflection layer may have an absorption coefficient (k) of greater than 0.5 and less than or equal to 4.0 ($0.5<k\leq4.0$). Also, the inorganic material included in the low reflection layer may have a refractive index (n) of 1 or more ($n\geq1.0$).

The low reflection layer induces destructive interference between light incident on the display panel and/or the electronic device and light reflected from the metal below the low reflection layer, so that external light reflectance may be reduced. Therefore, the display quality and visibility of the display panel and/or the electronic device may be improved.

In some embodiments, the capping layer may be omitted and the low reflection layer may be in contact with the opposite electrode 333.

According to an embodiment described above, even when the electronic module is arranged to overlap the active area, an electronic device with improved performance of the electronic module may be provided. However, the scope of the disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope as defined by the following claims.

What is claimed is:

1. An electronic device comprising:
a housing including a rear side and a lateral side;
a cover window arranged on the housing;
a display apparatus arranged under the cover window;
a sensor unit arranged under the display apparatus; and
a camera unit arranged under the display apparatus,
wherein the display apparatus comprises:
a substrate including a first area including a display area, a line area, and a transmission area, and a second area adjacent to the first area;
a first organic insulating layer arranged on the substrate of the first area and including a first hole corresponding to the transmission area;
a second organic insulating layer on the first organic insulating layer of the first area and including a second hole corresponding to the transmission area; and
a pixel defining layer on the second organic insulating layer of the first area and including a third hole corresponding to the transmission area,
wherein the pixel defining layer covers a side surface of the second organic insulating layer adjacent to the transmission area, and
the pixel defining layer is in direct contact with the side surface of the second organic insulating layer adjacent to the transmission area.

2. The electronic device of claim 1, wherein a horizontal distance between an end portion of the second organic insulating layer adjacent to the transmission area and an end portion of the pixel defining layer most adjacent to the end portion of the second organic insulating layer is about 2 μm to about 8 μm in a vertical cross-sectional view.

3. The electronic device of claim 1, wherein a side surface of the first organic insulating layer adjacent to the transmission area has a first angle with respect to a virtual line parallel to a horizontal plane of the substrate in a vertical cross-sectional view, and
a side surface of the pixel defining layer adjacent to the transmission area has a second angle with respect to the virtual line parallel to the horizontal plane of the substrate in the vertical cross-sectional view.

4. The electronic device of claim 3, wherein a sum of the first angle and the second angle is greater than about 20° and less than or equal to about 40°, the second angle is greater than or equal to about 20° and less than or equal to about 30°, and the first angle is greater than 0°.

5. The electronic device of claim 1, wherein the display apparatus further comprises a pixel electrode arranged between the pixel defining layer and the second organic insulating layer of the first area.

6. The electronic device of claim 5, wherein a horizontal distance between an end portion of the second organic insulating layer adjacent to the transmission area and an end portion of the pixel electrode most adjacent to the end portion of the second organic insulating layer is about 3 μm to about 6 μm in a vertical cross-sectional view.

7. The electronic device of claim 1, wherein the pixel defining layer is provided in an isolated shape in a plan view.

8. The electronic device of claim 5, wherein the display apparatus further comprises a black matrix and a color filter arranged on the pixel defining layer.

9. The electronic device of claim 8, wherein the black matrix includes an opening overlapping the pixel electrode, and the color filter is located in the opening.

10. The electronic device of claim 8, wherein the display apparatus further comprises an encapsulation member and an input sensor located between the pixel defining layer and the black matrix.

11. The electronic device of claim 1, wherein the display apparatus further comprises a third organic insulating layer located between the first organic insulating layer and the substrate of the first area.

12. The electronic device of claim 11, wherein the third organic insulating layer extends to the transmission area.

13. The electronic device of claim 12, wherein the display apparatus further comprises at least one insulating layer located between the third organic insulating layer and the substrate of the first area,
wherein the at least one insulating layer includes a fourth hole corresponding to the transmission area, and the third organic insulating layer covers a side surface of the at least one insulating layer.

14. The electronic device of claim 13, wherein the display apparatus further comprises a light blocking layer located between the at least one insulating layer and the substrate of the first area,
wherein the light blocking layer includes a fifth hole corresponding to the transmission area.

15. A display apparatus comprising:
a substrate including a first area including a display area, a line area, and a transmission area, and a second area adjacent to the first area;
a first organic insulating layer arranged over the substrate of the first area and including a first hole corresponding to the transmission area;

a second organic insulating layer arranged over the first organic insulating layer of the first area and including a second hole corresponding to the transmission area; and a pixel defining layer arranged over the second organic insulating layer of the first area and including a third hole corresponding to the transmission area, wherein the pixel defining layer covers a side surface of the second organic insulating layer adjacent to the transmission area, and the pixel defining layer is in direct contact with the side surface of the second organic insulating layer adjacent to the transmission area.

16. The display apparatus of claim 15, wherein a horizontal distance between an end portion of the second organic insulating layer adjacent to the transmission area and an end portion of the pixel defining layer most adjacent to the end portion of the second organic insulating layer is about 2 μm to about 8 μm in a vertical cross-sectional view.

17. The display apparatus of claim 15, wherein a side surface of the first organic insulating layer adjacent to the transmission area has a first angle with respect to a virtual line parallel to a horizontal plane of the substrate in a vertical cross-sectional view, and a side surface of the pixel defining layer adjacent to the transmission area has a second angle with respect to the virtual line parallel to the horizontal plane of the substrate in the vertical cross-sectional view.

18. The display apparatus of claim 17, wherein a sum of the first angle and the second angle is less than or equal to about 40°, and the second angle is greater than or equal to about 20° and less than or equal to about 30°, and the first angle is greater than 0°.

19. The display apparatus of claim 15, further comprising a pixel electrode arranged between the pixel defining layer and the second organic insulating layer of the first area.

20. The display apparatus of claim 19, wherein a horizontal distance between an end portion of the second organic insulating layer adjacent to the transmission area and an end portion of the pixel electrode most adjacent to the end portion of the second organic insulating layer is about 3 μm to about 6 μm in a vertical cross-sectional view.

21. The display apparatus of claim 15, wherein the pixel defining layer is provided in an isolated shape in a plan view.

22. The display apparatus of claim 19, further comprising a black matrix and a color filter arranged on the pixel defining layer.

23. The display apparatus of claim 22, wherein the black matrix includes an opening overlapping the pixel electrode, and the color filter is located in the opening.

24. The display apparatus of claim 22, further comprising an encapsulation member and an input sensor located between the pixel defining layer and the black matrix.

25. The display apparatus of claim 15, further comprising a third organic insulating layer located between the first organic insulating layer and the substrate of the first area.

26. The display apparatus of claim 25, wherein the third organic insulating layer extends to the transmission area.

27. The display apparatus of claim 26, further comprising at least one insulating layer located between the third organic insulating layer and the substrate of the first area, wherein the at least one insulating layer includes a fourth hole corresponding to the transmission area, and the third organic insulating layer covers a side surface of the at least one insulating layer.

28. The display apparatus of claim 27, further comprising a light blocking layer located between the at least one insulating layer and the substrate of the first area, wherein the light blocking layer includes a fifth hole corresponding to the transmission area.

* * * * *